(12) United States Patent
Ukeda et al.

(10) Patent No.: US 6,346,736 B1
(45) Date of Patent: Feb. 12, 2002

(54) TRENCH ISOLATED SEMICONDUCTOR DEVICE

(75) Inventors: Takaaki Ukeda, Osaka; Chiaki Kudo, Kyoto; Toshiki Yabu, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/469,498

(22) Filed: Dec. 22, 1999

Related U.S. Application Data

(62) Division of application No. 08/978,137, filed on Nov. 25, 1997, now Pat. No. 6,130,139.

(30) Foreign Application Priority Data

Nov. 26, 1996 (JP) ................................. 8-314762
Feb. 6, 1997 (JP) ................................. 9-023844

(51) Int. Cl.⁷ ............................................. H01L 33/00
(52) U.S. Cl. ....................................... 257/509; 257/545
(58) Field of Search ................................. 257/509, 506, 257/545, 598

(56) References Cited

U.S. PATENT DOCUMENTS

| | | | |
|---|---|---|---|
| 3,622,382 A | 11/1971 | Brack et al. ................. 428/448 |
| 4,929,566 A | 5/1990 | Beitman ....................... 438/423 |
| 4,948,742 A | 8/1990 | Nishimura et al. ........... 438/423 |
| 5,270,265 A | 12/1993 | Hemmenway et al. ....... 438/404 |
| 5,371,401 A | * 12/1994 | Kurita ......................... 257/254 |
| 5,426,062 A | 6/1995 | Hwang ........................ 438/423 |
| 5,663,588 A | * 9/1997 | Suzuki et al. ............... 257/350 |
| 5,665,633 A | 9/1997 | Meyer |
| 5,731,623 A | * 3/1998 | Ishimaru ..................... 257/517 |
| 5,760,444 A | 6/1998 | Okumura ..................... 257/350 |
| 5,856,218 A | 1/1999 | Kinoshita et al. ........... 438/414 |
| 5,877,066 A | 3/1999 | Stolmeijer et al. .......... 438/424 |
| 6,028,344 A | * 2/2000 | Hashimoto ................... 257/587 |

FOREIGN PATENT DOCUMENTS

| | | |
|---|---|---|
| EP | 02-20500 | 9/1986 |
| EP | 05-38807 | 10/1992 |
| JP | 58-200554 | 11/1983 |
| JP | 60-015944 | 1/1985 |
| JP | 63-246842 | 10/1988 |
| JP | 02-272745 | 11/1990 |
| JP | 05-013565 | 1/1993 |

* cited by examiner

Primary Examiner—Stephen D. Meier
(74) Attorney, Agent, or Firm—McDermott & Will & Emery

(57) ABSTRACT

The top surface of a P-type semiconductor substrate is partitioned into an active region to be formed with an element and an isolation region surrounding the active region. The isolation region is composed of trench portions and dummy semiconductor portions. An interlayer insulating film is deposited on the substrate, followed by a wire formed thereon. In each of the semiconductor portions, an impurity diffusion layer is formed simultaneously with the implantation of ions into the element so that a PN junction is formed between the impurity diffusion layer and the silicon substrate. A capacitance component of the wiring-to-substrate capacitance in the region containing the semiconductor portions is obtained by adding in series the capacitance in the impurity diffusion layer to the capacitance in the interlayer insulating film, which is smaller than the capacitance only in the interlayer insulating film. What results is a semiconductor device having lower total wiring-to-substrate capacitance and a higher operating speed.

20 Claims, 21 Drawing Sheets

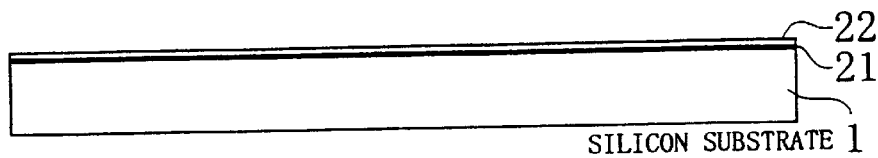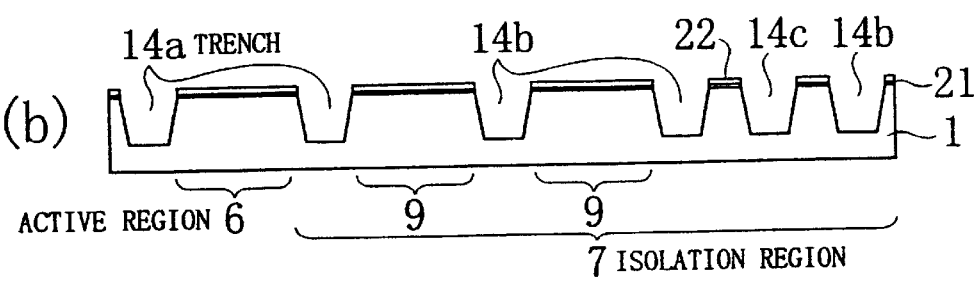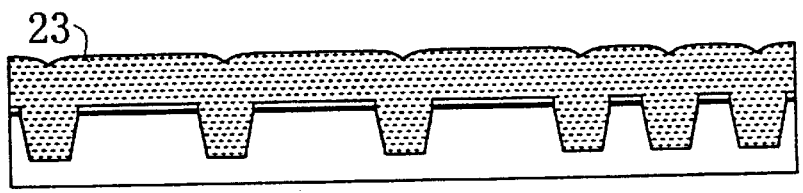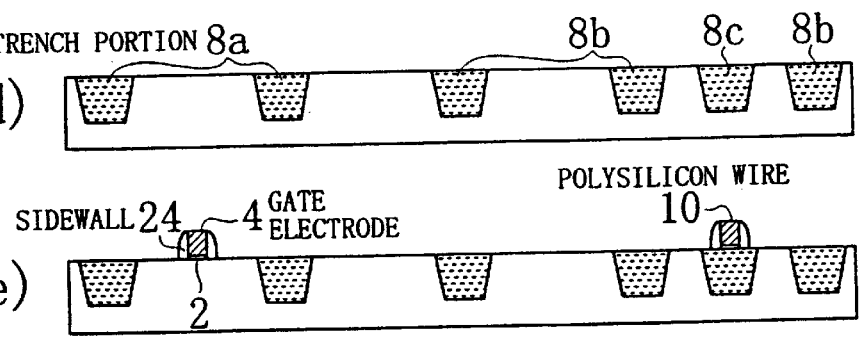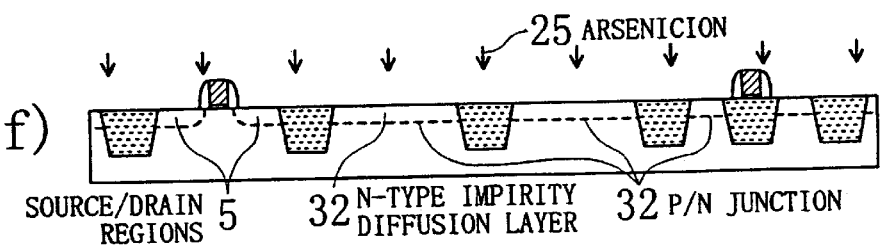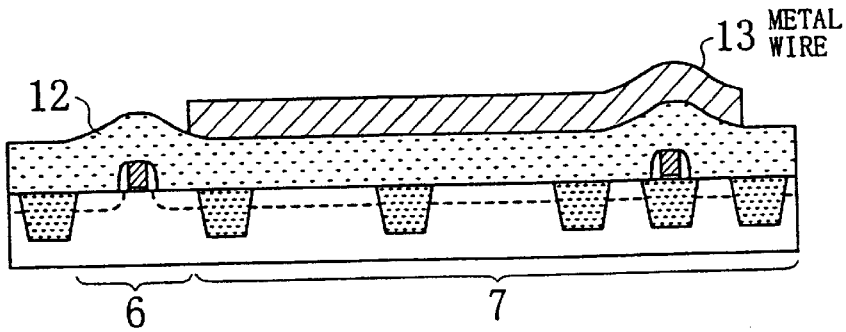

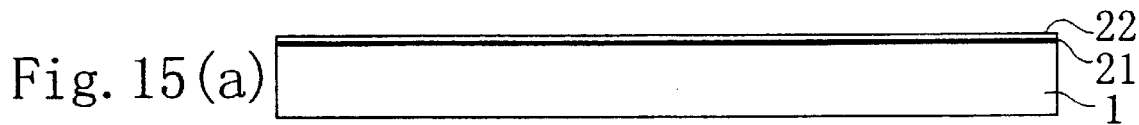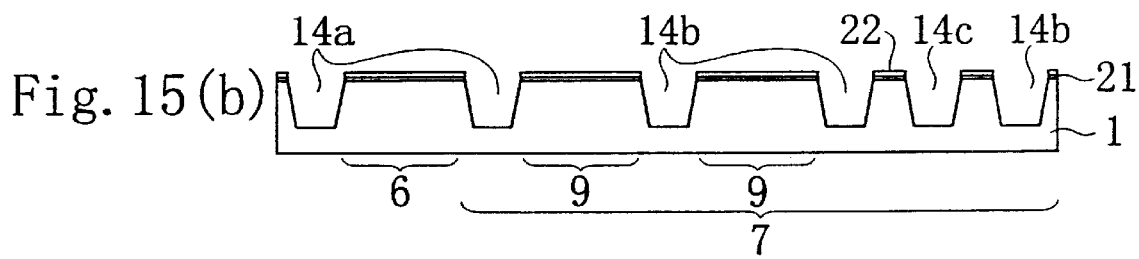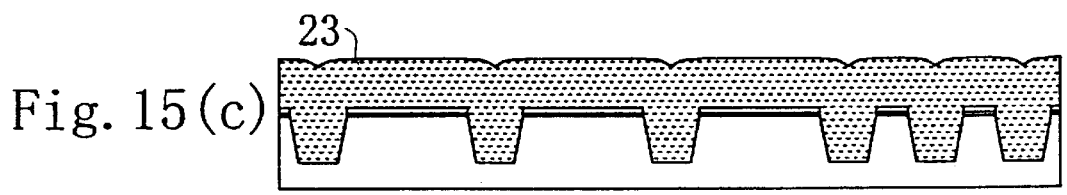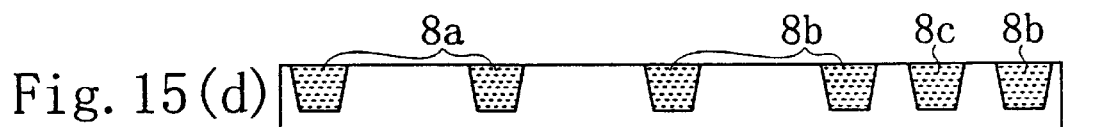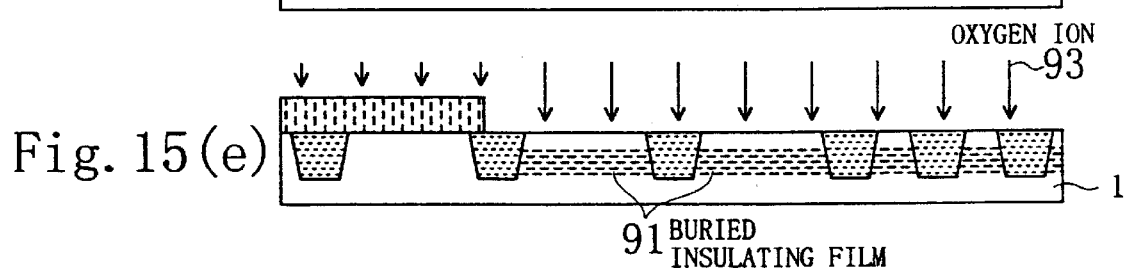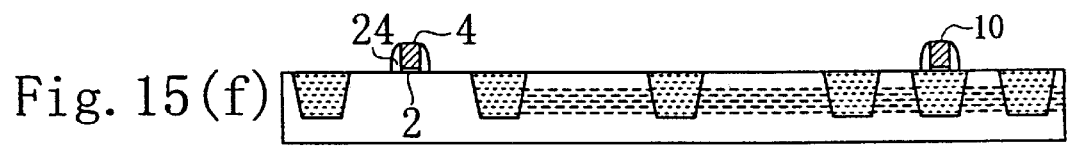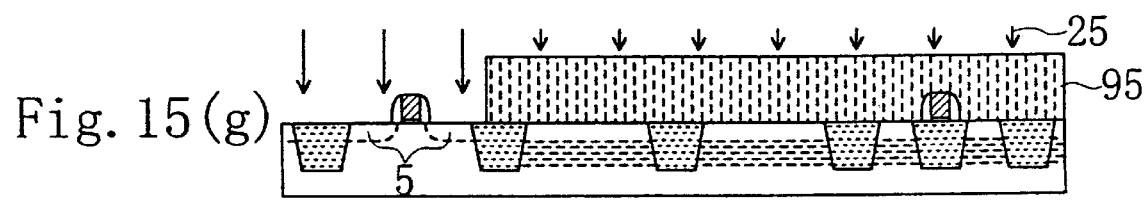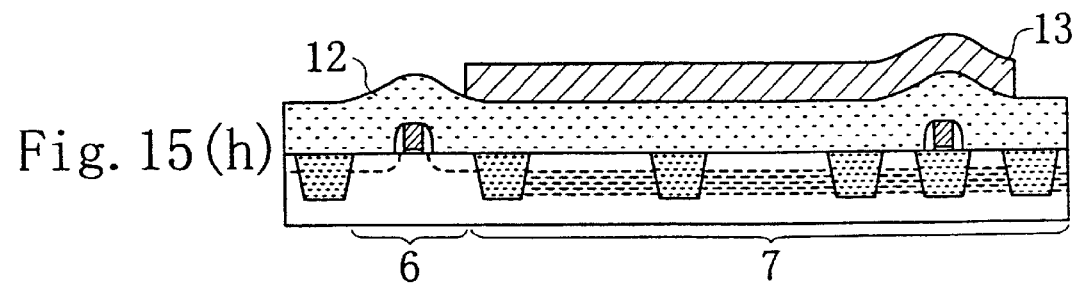

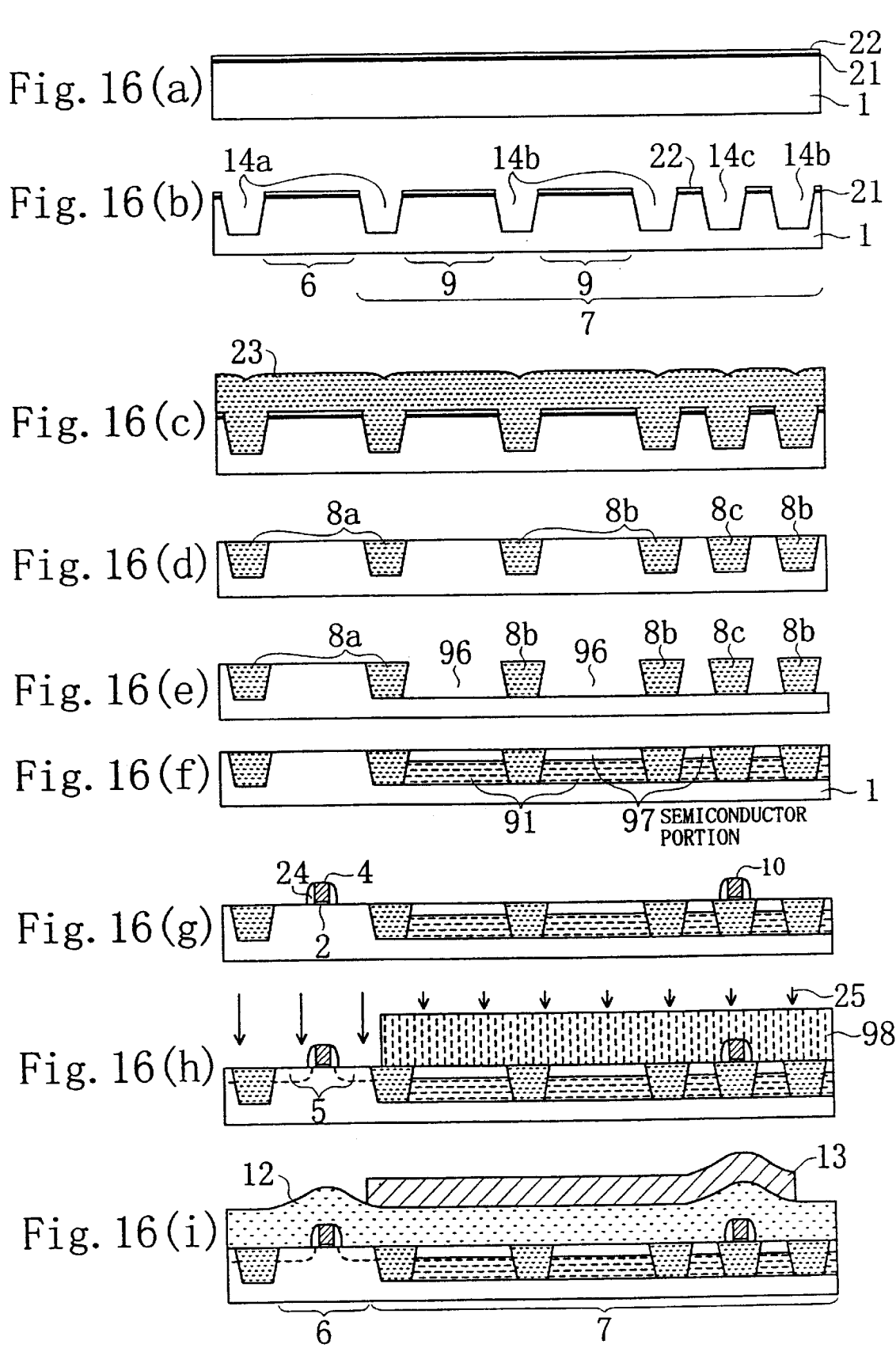

TRENCH ISOLATED SEMICONDUCTOR DEVICE

This is a divisional application of Ser. No. 08/978,137, Nov. 25, 1997 now U.S. Pat. No. 6,130,139.

The present invention relates to a semiconductor device having a trench-isolated structure and, more particularly, to a method of reducing the capacitance between the wiring and substrate of the semiconductor device.

As higher-density and increasingly miniaturized semiconductor devices have been implemented in recent years, repeated attempts have been made to substitute a trench isolation technique for a LOCOS technique which is most prevalently used to form isolation for providing insulation between individual elements of the semiconductor devices. In accordance with the trench isolation technique, an insulating material is filled in a trench formed in a semiconductor substrate to form isolation.

Since planarization of a surface of a semiconductor substrate including the insulating material filled in the trench is important to the trench isolation technique, chemical mechanical polishing (CMP) has been used as a planarizing technique which achieves excellent in-plane uniformity free from pattern dependence. In the case where the trench occupies a large area in a CMP process for planarization, the provision of dummy island semiconductor portions has been proposed to avoid trouble resulting from so-called pattern dependence, which causes polishing properties to vary depending on the area of a region to be planarized. In other words, the trench is divided into a plurality of narrow trenches so that the surface of the semiconductor substrate is exposed between the individual trenches to form the dummy semiconductor portions which do not serve as active regions.

FIG. 19 shows an example of the conventional trench-isolated semiconductor device having the dummy island semiconductor portions.

As shown in FIG. 19, an active region 6 of a P-type silicon substrate 1 is formed with: a gate oxide film 2; a gate electrode 4 made of a polysilicon film; and source/drain regions 5 into which an impurity has been introduced. An isolation region 7 surrounding the active region 6 is formed with a plurality of trench portions 8 each filled with a silicon oxide film. Between the individual trench portions 8, there are provided semiconductor portions 9 having top surfaces at the same level as the top surfaces of the trench portions 8. On the trench portions 8 also, there is provided a polysilicon wire 10 formed simultaneously with the gate oxide film 2 and the gate electrode 4 of an element. An interlayer insulating film 12 is deposited over the entire surface of the substrate, followed by a metal wire 13 provided thereon.

In this case, if the trench portions have such large widths as shown in FIG. 21(b), a silicon oxide film filled in each of the trench portions is polished during the CMP process for planarizing the whole substrate so that the surface thereof is depressed due to pattern dependence, which leads to the trouble of degraded planarity or the like. The isolation structure as shown in FIG. 19 has been proposed to prevent such trouble resulting from pattern dependence.

FIGS. 20(a) to 20(g) are cross-sectional views illustrating a process of manufacturing the conventional trench-isolated semiconductor device having an NMOS transistor.

In the step shown in FIG. 20(a), a thin silicon oxide film 21 having a thickness of 10 nm and a silicon nitride film 22 are formed sequentially on the P-type silicon substrate 1.

In the step shown in FIG. 20(b), a plurality of trenches 14 each having a given width are formed in the silicon substrate 1. However, the trenches 14 include: trenches 14a formed to surround the active region 6 to be formed with the element; trenches 14b formed in the isolation region 7 separated from the active region 6 by the trenches 14a to eliminate pattern dependence from planarity obtained at the completion of the manufacturing process; and trenches 14c for forming the polysilicon wires. In the isolation region 7 also, the semiconductor portions 9 have been provided to form at least one projecting portion surrounded by the trenches 14. The semiconductor portions 9 may be considered as dummy active regions which do not function as active regions.

In the step shown in FIG. 20(c), a silicon oxide film 23 is deposited over the entire surface of the substrate to fill in the trenches 14.

In the step shown in FIG. 20(d), the silicon oxide film 23 is polished by a CMP method. Subsequently, the silicon nitride film 22 and the silicon oxide film 21 are removed selectively to form the plurality of buried trench portions 8 each filled with the silicon oxide film and having a planarized surface. The buried trench portions 8 include: buried trench portions 8a functioning as isolation; buried trench portions 8b forming the dummy semiconductor portions 9; and buried trench portions 8c for providing insulation between the polysilicon wires and the silicon substrate.

In the step shown in FIG. 20(e), there are formed the gate oxide film 2, the gate electrode 4 having sidewalls 24 on the side faces thereof, and the polysilicon wire 10 by using a known technique. The gate electrode 4 and the polysilicon wire 10 are formed simultaneously.

In the step shown in FIG. 20(f), arsenic ions 25 are implanted into the active region 6 of the NMOSFET region by using a resist mask Rem covering the PMOSFET region and the isolation region to form the source/drain regions 5. The NMOSFET is formed by the foregoing process steps.

In the step shown in FIG. 20(g), the silicon oxide film is deposited to form the interlayer insulating film 12, followed by the metal wire 13 formed thereon.

In the foregoing step shown in FIG. 20(f), ions of such an impurity as phosphorus or arsenic have been implanted into the gate electrode 4 and source/drain regions 5 of the active region 6 in the step shown in FIG. 20(f). However, impurity ions are not implanted in principle in the region other than the active region 6, though they may be introduced slightly extensively into the periphery of the isolation region in considerations of mask displacement. Hence, impurity ions are not implanted in the dummy semiconductor portions 9 between the individual trench portions 8.

A description will be given to the wiring-to-substrate capacitance of the trench-isolated semiconductor device having the small trench portions 8 which are discretely located and the dummy semiconductor portions 9 as shown in FIG. 19 and in a semiconductor device having a wide isolating/insulating film such as a LOCOS film. FIG. 21(a) is a cross-sectional view for illustrating, by way of example, the wiring-to-substrate capacitance in the isolation region 7 having the dummy semiconductor portions 9. FIG. 21(b) is a cross-sectional view for illustrating the wiring-to-substrate capacitance of the semiconductor device having a LOCOS isolation film 100 and no dummy semiconductor portion. It is assumed here that impurity ions have not been implanted in the isolation region 7 during the implantation of ions into the source/drain regions and that the area occupied by the whole isolation region 7 is equal in each of the two semiconductor devices.

In the semiconductor device shown in FIG. 21(a), a total wiring-to-substrate capacitance Cat corresponds to the sum of capacitances Ca1 and Ca2, which is represented by the following equation (1):

$$Cat=\Sigma Ca1+\Sigma Ca2 \qquad (1).$$

In the case where a member interposed between the wiring and substrate is composed of a homogeneous material, the wiring-to-substrate capacitance per unit area is inversely proportional to the distance between the wiring and substrate, so that the capacitance is larger as the distance is shorter. If the total wiring-to-substrate of the semiconductor device shown in FIG. 21(b) is represented by Cbt when the dimension Da2 shown in FIG. 21(a) is equal to the dimension Dbt shown in FIG. 21(b), the following inequality (2) is satisfied:

$$Cat>Cbt \qquad (2),$$

which indicates that the wiring-to-substrate capacitance Cat in the structure shown in FIG. 21(a) is larger than the wiring-to-substrate capacitance Cbt in the structure shown in FIG. 21(b).

Although the formation of the island pattern composed of the dummy semiconductor portions in the isolation region has the advantage of achieving planarization with excellent in-plane uniformity, it also has the possibility of increasing the wiring-to-substrate capacitance and resultantly reducing the operating speed of the semiconductor device.

SUMMARY OF THE INVENTION

In view of the foregoing, the present invention has been achieved based on the principle that, if each electrode of a parallel-plate capacitor occupies an equal area, the capacitance of the capacitor is generally smaller as the distance between the electrodes is larger or on the physical phenomenon that, even when the capacitor has equal capacitance, the amount of charge accumulated therein is smaller as the voltage between the electrodes is lower.

It is therefore an object of the present invention to increase the operating speed of a trench-isolated semiconductor device comprising an isolation region consisting of trench portions and dummy semiconductor portions by providing therein means for reducing the wiring-to-substrate capacitance in the isolation region or means for reducing the amount of charge accumulated in the capacitance present between the wiring and substrate in the isolation region.

A first semiconductor device according to the present invention comprises: a semiconductor substrate having an active region and an isolation region surrounding the active region; a plurality of trench portions each formed in the isolation region and filled with an insulating material; semiconductor portions interposed between the individual trench portions in the isolation region; an interlayer insulating film formed to extend continuously over the active region and the isolation region; a wire formed on the interlayer insulating film; and at least one PN junction formed in the semiconductor portions underlying the wire.

In the arrangement, the capacitance component of the wiring-to-substrate capacitance in the region containing the semiconductor portions of the isolation region is obtained by adding in series the capacitance in the upper portion of the PN junction of each of the semiconductor portions to the capacitance in the interlayer insulating film, which is smaller than the capacitance only in the interlayer insulating film. Accordingly, the wiring-to-substrate capacitance of the whole semiconductor device is reduced, resulting in the semiconductor device operating at a higher speed.

The PN junction may include a plurality of PN junctions formed in the semiconductor portions.

The arrangement achieves a further reduction in wiring-to-substrate capacitance, resulting in a higher operating speed.

The active region may be formed with an impurity diffusion region and a PN junction may be formed at a bottom face of the impurity diffusion region, the PN junction of the isolation region being positioned at a level lower than the PN junction of the active region.

The arrangement further reduces the wiring-to-substrate capacitance.

A second semiconductor device according to the present invention comprises: a semiconductor substrate having an active region and an isolation region surrounding the active region; a plurality of trench portions each formed in the isolation region and filled with an insulating material; semiconductor portions interposed between the individual trench portions in the isolation region; an interlayer insulating film formed to extend continuously over the active region and the isolation region; a wire formed on the interlayer insulating film; and a dielectric film interposed between at least the semiconductor portions of the isolation region and the interlayer insulating film.

In the arrangement, the capacitance component of the wiring-to-substrate capacitance in the region containing the semiconductor portions of the isolation region is obtained by adding in series the capacitance in the dielectric film to the capacitance in the interlayer insulating film, so that the total wiring-to-substrate capacitance is lowered. Consequently, the operating speed of the semiconductor device is increased.

As the dielectric film, an underlying insulating film may be provided between the interlayer insulating film and the semiconductor portions and trench portions.

There can be further provided a gate electrode formed on the semiconductor substrate within the active region and sidewalls made of an insulating material and formed on both side faces of the gate electrode such that the underlying insulating film is formed of the same film as forming the sidewalls.

The underlying insulating film may be composed of a multilayer film.

The arrangement enables the underlying insulating film for reducing the wiring-to-substrate capacitance to be composed by using the sidewalls required to form a MOSFET of so-called LDD structure. Consequently, the wiring-to-substrate capacitance can be reduced, while avoiding an increase in manufacturing cost.

The dielectric film may be formed in an upper portion of each of the semiconductor portions of the semiconductor substrate to have a top face at approximately the same level as a top face of each of the trench portions.

Preferably, the dielectric film is composed of at least one of a silicon oxide film and a silicon nitride film.

A third semiconductor device according to the present invention comprises: a semiconductor substrate having an active region and an isolation region surrounding the active region; a plurality of trench portions each formed in the isolation region and filled with an insulating material; semiconductor portions interposed between the individual trench portions in the isolation region; an interlayer insulating film formed to extend continuously over the active region and the isolation region; a wire formed on the interlayer insulating film; and a buried insulating film formed in an inner portion of each of the semiconductor portions in the isolation region.

The arrangement allows a reduction in the wiring-to-substrate capacitance of the entire isolation region, resulting in a significant reduction in operating speed.

A fourth semiconductor device according to the present invention comprises: a semiconductor substrate having an active region and an isolation region surrounding the active region; a plurality of trench portions each formed in the isolation region and filled with an insulating material; semiconductor portions interposed between the individual trench portions in the isolation region; an interlayer insulating film formed to extend continuously over the active region and the isolation region; a wire formed on the interlayer insulating film; an a resistor film formed between the interlayer insulating film and at least the semiconductor portions of the isolation region.

In the arrangement, a voltage drop in the resistor film reduces the amount of charge accumulated in the wiring-to-substrate capacitance in the region of the semiconductor device containing the resistor film, though the wiring-to-substrate capacitance is not reduced in the region. Consequently, the time required for charging or discharging is reduced, resulting in the semiconductor device operating at a higher speed.

As the resistor film, an underlying resistor film may be formed to extend continuously over the semiconductor portions and trench portions.

The arrangement allows the wiring-to-substrate capacitance to be reduced by using various films having electric resistivity which are formed on the semiconductor substrate.

There can further be provided a resistor element formed on the semiconductor substrate and having a high resistor film such that the underlying resistor film is formed of the same film as composing the high resistor film of the resistor element.

In the arrangement, the underlying resistor film having the same resistance as the high resistor film used as a resistor element achieves a remarkable voltage dropping effect.

There can further be provided an element having an electrode member composed of a conductor film formed on the semiconductor substrate within the active region such that the resistor film is composed of the same material as composing the electrode member.

There can further be provided a FET having a gate electrode composed of a first conductor film formed on the semiconductor portion within the active region and a second conductor film deposited on the first conductor film such that a top surface of the first conductor film of the gate electrode is at approximately the same level as a top surface of each of the trench portions, while a region of the resistor film overlying each of the semiconductor portions is formed of the same two films as composing the first and second conductor films of the gate electrode and a region of the resistor film overlying each of the trench portions is composed of the same material as composing the first conductor film of the gate electrode.

Each of the arrangements eliminates the necessity for an additional step of forming the resistor film, so that the wiring-to-substrate capacitance is reduced, while an increase in manufacturing cost is prevented.

The resistor film may be formed in an upper portion of each of the semiconductor portions of the semiconductor substrate to have a top face at approximately the same level as a top surface of each of the trench portions.

The resistor film may be composed of a silicon film containing at least one of an oxygen atom and a nitrogen atom.

The resistor film may be composed of at least one of a polysilicon film and an amorphous silicon film.

The arrangement allows the formation of the resistor film by using the polysilicon film or amorphous silicon film to compose the gate electrode and the resistor element and thereby prevents an increase in manufacturing cost.

A first method of manufacturing a semiconductor device according to the present invention comprises: a first step of forming, in a semiconductor substrate having a substrate region of a first conductivity type, a first trench for partitioning the substrate region into an active region and an isolation region and a second trench for partitioning the isolation region into a plurality of dummy semiconductor portions; a second step of filling an insulating material in each of the first and second trenches to form a first buried trench portion and a second buried trench portion; a third step of forming an element on the active region; a fourth step of introducing an impurity containing at least an impurity of a second conductivity type into the dummy semiconductor portions of the isolation region to form at least one PN junction in the dummy semiconductor portions; a fifth step of forming an interlayer insulating film over an entire surface of the substrate; and a sixth step of forming a wire on the interlayer insulating film.

The methods enables the formation of the semiconductor device including the dummy semiconductor portions each having the PN junction. The capacitance component of the wiring-to-substrate capacitance in the region containing the semiconductor portions of the isolation region is obtained by adding in series the capacitance in the upper portion of the PN junction of each of the semiconductor portions to the capacitance in the interlayer insulating film, which is smaller than the capacitance only in the interlayer insulating film. Accordingly, the wiring-to-substrate capacitance of the whole semiconductor device is reduced, resulting in the semiconductor device operating at a higher speed.

The third and fourth steps may include forming a gate electrode of a FET as the element on the active region, introducing the impurity of the second conductivity type into the active region and the dummy semiconductor portions, and thereby forming source/drain regions of the FET, while forming the at least one PN junction in the dummy semiconductor portions.

The method enables the formation of the semiconductor device operating at a high speed by using a typical manufacturing process for forming a FET without an additional step of forming the PN junction in each of the dummy semiconductor portions.

The third step may include forming a gate electrode of a FET as the element on the active region by using a first mask covering the isolation region and introducing the impurity of the second conductivity type into the active region to form source/drain regions of the FET and the fourth step may include introducing the impurity containing at least the impurity of the second conductivity type into the dummy semiconductor portions by using a second mask covering the active region to form the at least one PN junction in the dummy semiconductor portions.

The method enables the formation of the semiconductor device having an arbitrary number of PN junctions without placing restraints on the depth and impurity concentration of the PN junction in the active region, resulting in a semiconductor device having minimum wiring-to-substrate capacitance.

A second method of manufacturing a semiconductor device according to the present invention comprises: a first step of forming, in a semiconductor substrate having a substrate region, a first trench for partitioning the substrate region into an active region and an isolation region and a second trench for partitioning the isolation region into a plurality of dummy semiconductor portions; a second step of filling an insulating material in each of the first and second trenches to form a first buried trench portion and a second buried trench portion; a third step of forming an element on the active region; a fourth step of forming a resistor film on each of the dummy semiconductor portions of the isolation region; a fifth step of forming an interlayer insulating film over an entire surface of the substrate; and a sixth step of forming a wire on the interlayer insulating film.

The method enables the formation of the semiconductor device comprising the resistor film between the interlayer insulating film and dummy semiconductor portions of the isolation region. A voltage drop in the resistor film reduces the amount of charge accumulated in the wiring-to-substrate capacitance, though the wiring-to-substrate capacitance is not reduced in the region containing the resistor film of the semiconductor device. Consequently, the time required for charging or discharging is reduced, resulting in the semiconductor device operating at a higher speed.

The fourth step may include composing the resistor film of a film containing at least one of polysilicon and amorphous silicon.

The fourth step may include composing the resistor film of a multilayer film constituted by two or more conductor films with at least an insulating film interposed therebetween.

The fourth step may include introducing an impurity at a concentration of $1 \times 10^{20}$ atoms·cm$^{-3}$ or lower into the resistor film.

A third method of manufacturing a semiconductor device according to the present invention comprises: a first step of forming, in a semiconductor substrate having a substrate region, a first trench for partitioning the substrate region into an active region and an isolation region and a second trench for partitioning the isolation region into a plurality of dummy semiconductor portions; a second step of filling an insulating material in each of the first and second trenches to form a first buried trench portion and a second buried trench portion; a third step of forming an element on the active region; a fourth step of implanting ions into an upper portion of each of the dummy semiconductor portions to form a high resistor portion therein; a fifth step of forming an interlayer insulating film over an entire surface of the substrate; and a sixth step of forming a wire on the interlayer insulating film.

The method allows the formation of the semiconductor device comprising the high resistor portion between the interlayer insulating film and dummy semiconductor portions of the isolation region. As described above, a voltage drop in the region containing the high resistor portion of the semiconductor device reduces the amount of charge accumulated in the wiring-to-substrate capacitance. What results is the semiconductor device which requires a shorter time for charging or discharging and therefore operates insulating film at a higher speed.

The fourth step may include implanting ions containing at least an atom having an oxidizing function to form the high resistor portion.

The fourth step may include implanting ions containing at least an atom having a nitriding function to form the high resistor portion.

A fourth method of manufacturing a semiconductor device according to the present invention comprises: a first step of forming, in a semiconductor substrate having a substrate region, a first trench for partitioning the substrate region into an active region and an isolation region and a second trench for partitioning the isolation region into a plurality of dummy semiconductor portions; a second step of filling an insulating material in each of the first and second trenches to form a first buried trench portion and a second buried trench portion; a third step of forming an element on the active region; a fourth step of forming an underlying insulating film over the dummy semiconductor portions of the isolation region; a fifth step of forming an interlayer insulating film over an entire surface of the substrate; and a sixth step of forming a wire on the interlayer insulating film.

In accordance with the method, there is formed the semiconductor device including the underlying insulating film beneath the interlayer insulating film in the isolation region thereof. Consequently, the capacitance component of the wiring-to-substrate capacitance in the region containing the semiconductor portions of the isolation region is obtained by adding in series the capacitance in the underlying insulating film to the capacitance in the interlayer insulating film, so that the total wiring-to-substrate capacitance is reduced. What results is the semiconductor device operating at a high speed.

The third step and the fourth step may include forming a gate electrode of a FET forming the element on the active region, depositing a dielectric film on the substrate, performing anisotropic etching with respect to the dielectric film by using a mask covering the isolation region, and thereby leaving sidewalls on both side faces of the gate electrode, while leaving the underlying insulating film over the dummy semiconductor portions.

The method enables the formation of a semiconductor device operating at a high speed by using a typical manufacturing process for forming a FET without an additional step of forming the underlying insulating film.

The fourth step may include forming the underlying insulating film of a dielectric film containing at least silicon oxide.

The fourth step may include forming the underlying insulating film of a dielectric film containing at least silicon nitride.

A fifth method of manufacturing a semiconductor device according to the present invention comprises: a first step of forming, in a semiconductor substrate having a substrate region, a first trench for partitioning the substrate region into an active region and an isolation region and a second trench for partitioning the isolation region into a plurality of dummy semiconductor portions; a second step of filling an insulating material in each of the first and second trenches to form a first buried trench portion and a second buried trench portion; a third step of forming an element on the active region; a fourth step of forming depressed portions by etching the dummy semiconductor portions and filling an insulating material in the depressed portions to form inter-trench insulating films each having a top face at the same level as respective top faces of the first and second buried trench portions; a fifth step of forming an interlayer insulating film over an entire surface of the substrate; and a sixth step of forming a wire on the interlayer insulating film.

In accordance with the method, there is formed the semiconductor device comprising the inter-trench insulating films between the interlayer insulating films and dummy semiconductor portions of the isolation region thereof.

Consequently, the capacitance component of the wiring-to-substrate capacitance in the region containing the semiconductor portions of the isolation region is obtained by adding in series the capacitance in the inter-trench buried insulating films to the capacitance in the interlayer insulating film, so that the total wiring-to-substrate capacitance is reduced. What results is the semiconductor device operating at a high speed.

The fourth step may include forming each of the inter-trench insulating films of a dielectric film containing at least silicon oxide.

The fourth step may include forming each of the inter-trench insulating films of a dielectric film containing at least silicon nitride.

A sixth method of manufacturing a semiconductor device according to the present invention comprises: a first step of forming, in a semiconductor substrate having a substrate region, a first trench for partitioning the substrate region into an active region and an isolation region and a second trench for partitioning the isolation region into a plurality of dummy semiconductor portions; a second step of filling an insulating material in each of the first and second trenches to form a first buried trench portion and a second buried trench portion; a third step of forming an element on the active region; a fourth step of implanting oxygen ions into each of the dummy semiconductor portions to form a buried insulating film in an inner portion thereof; a fifth step of forming an interlayer insulating film over an entire surface of the substrate; and a sixth step of forming a wire on the interlayer insulating film.

A seventh method of manufacturing a semiconductor device according to the present invention comprises: a first step of forming, in a semiconductor substrate having a substrate region, a first trench for partitioning the substrate region into an active region and an isolation region and a second trench for partitioning the isolation region into a plurality of dummy semiconductor portions; a second step of filling an insulating material in each of the first and second trenches to form a first buried trench portion and a second buried trench portion; a third step of forming third trenches by etching the semiconductor portions and filling an insulating material in the third trenches to form buried insulating films each having a top face at a level lower than respective top faces of the first and second buried trench portions; a fourth step of growing semiconductor films on the buried insulating films, with the active region covered with a mask member, to form dummy semiconductor portions; a sixth step of forming an interlayer insulating film over an entire surface of the substrate; a fifth step of forming an element on the active region; a seventh step of forming a wire on the interlayer insulating film.

An eighth method of manufacturing a semiconductor device according to the present invention comprises: a first step of forming, in a semiconductor substrate having a substrate region, a first trench extending over an entire isolation region of the substrate region, while leaving an active region of the substrate region; a second step of filling an insulating material in the first trench to form a buried insulating film having a top face at the same level as a top face of the isolation region; a third step of growing a semiconductor film over the active region and the buried insulating film; a fourth step of forming, in the semiconductor substrate, a second trench for partitioning the semiconductor film and the substrate region into the active region and the isolation region and a third trench for partitioning the portion of the semiconductor film overlying the isolation region into a plurality of dummy semiconductor portions; a fifth step of filling an insulating material in each of the second and third trenches to form a first buried trench portion and a second buried trench portion; a sixth step of forming an element on the portion of the semiconductor film overlying the active region; a seventh step of forming an interlayer insulating film over an entire surface of the substrate; and an eighth step of forming a wire on the interlayer insulating film.

In accordance with the methods, there are obtained semiconductor devices each comprising a buried insulating film at a depth of each of the dummy semiconductor portions of the isolation region. What results is the semiconductor device having smaller wiring-to-substrate capacitance and operating at a higher speed.

BRIEF DESCRIPTION OF THE DRAWINGS

FIGS. 2(a) to 2(g) are cross-sectional views illustrating a process of manufacturing the semiconductor device according to the first embodiment;

FIGS. 15(a) to 15(h) are cross-sectional views illustrating a process of manufacturing a semiconductor device according to the ninth embodiment;

FIGS. 16(a) to 16(i) are cross-sectional views illustrating a process of manufacturing a semiconductor device according to a tenth embodiment;

DETAILED DESCRIPTION OF THE INVENTION

Figure 1A:
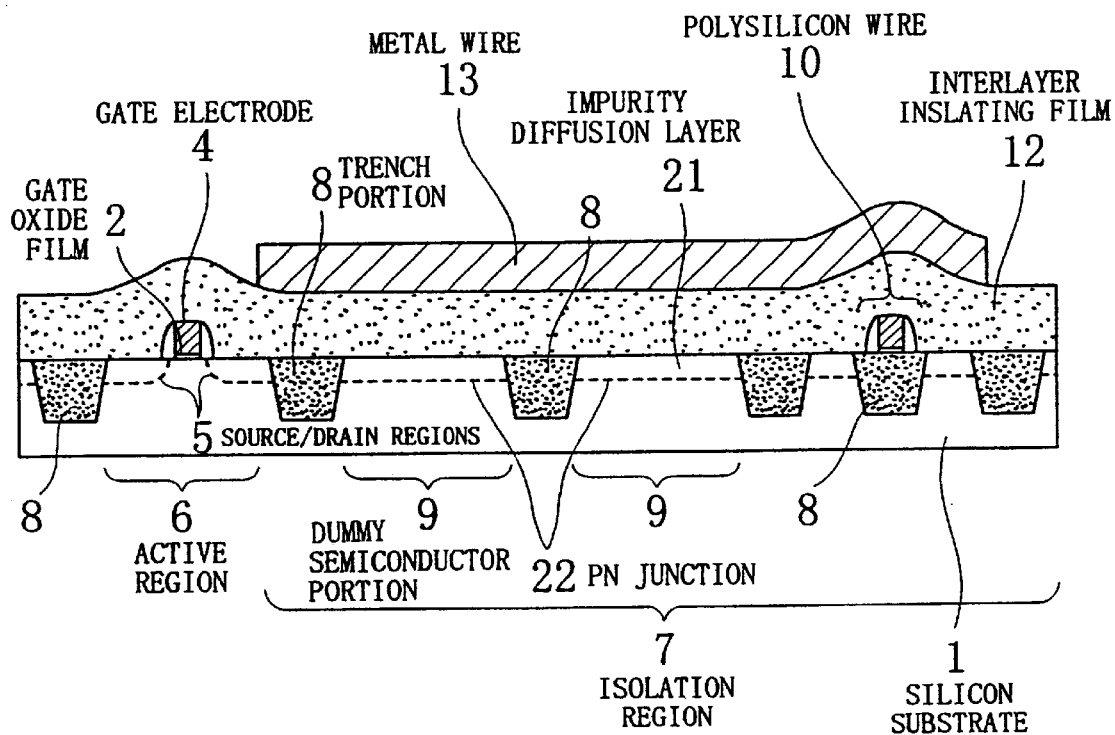
FIG. 1(a) is a cross-sectional view of a semiconductor device according to a first embodiment, having shallow PN junctions formed in the semiconductor portions thereof

Referring now to the drawings, the embodiments of the present invention will be described.

(First Embodiment)

FIG. 1(a) is a cross-sectional view of a semiconductor device having a MOSFET according to a first embodiment. As shown in the drawing, a first active region 6 of a P-type silicon substrate 1 is provided with an element functioning as the MOSFET composed of: a gate oxide film 2; a gate electrode 4 made of a polysilicon film; and source/drain regions 5. An isolation region 7 for electrically isolating the individual elements is formed with a plurality of trench portions 8 each filled with a silicon oxide film as an insulating material and with dummy semiconductor portions 9 provided between the individual trench portions 8 and not serving as active regions. On one of the trench portions 8 formed in the isolation region 7, there is provided a polysilicon wire 10 formed simultaneously with the gate insulating film 2 and the gate electrode 4. There are further provided an interlayer insulating film 12 made of a silicon oxide film deposited over the entire surface of the substrate and a metal wire 13 formed on the interlayer insulating film 12.

Each of the semiconductor portions 9 formed in the isolation region 7 is provided with an impurity diffusion layer 21 into which an N-type impurity of the conductivity type opposite to that of the silicon substrate 1 has been introduced, so that a PN junction 22 is formed between the impurity diffusion layer 21 and the silicon substrate 1. The PN junction 22 is positioned at a level between those of the top and bottom faces of the trench portions 8.

Figure 1B:
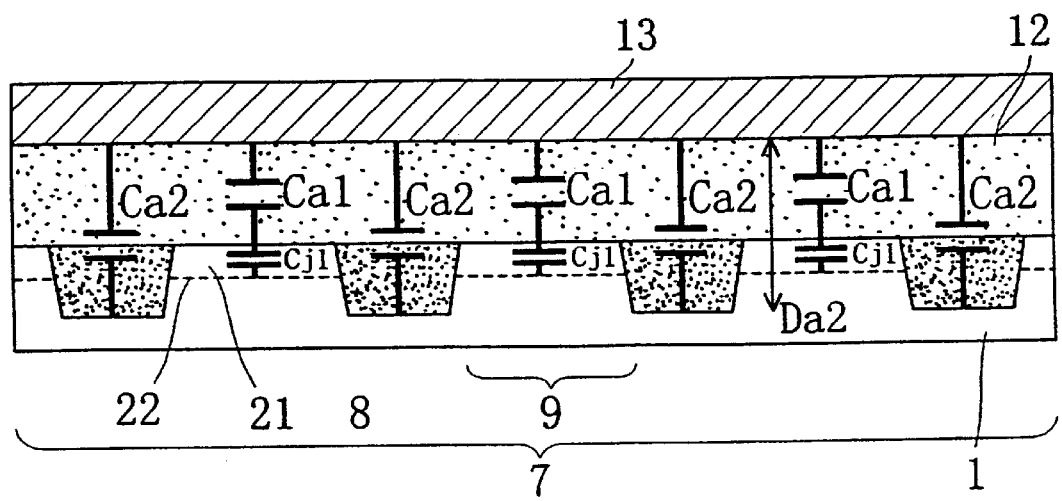
FIG. 1(b) is an enlarged cross-sectional view of an isolation region for illustrating the wiring-to-substrate capacitance in the semiconductor device.
Figure 21A:
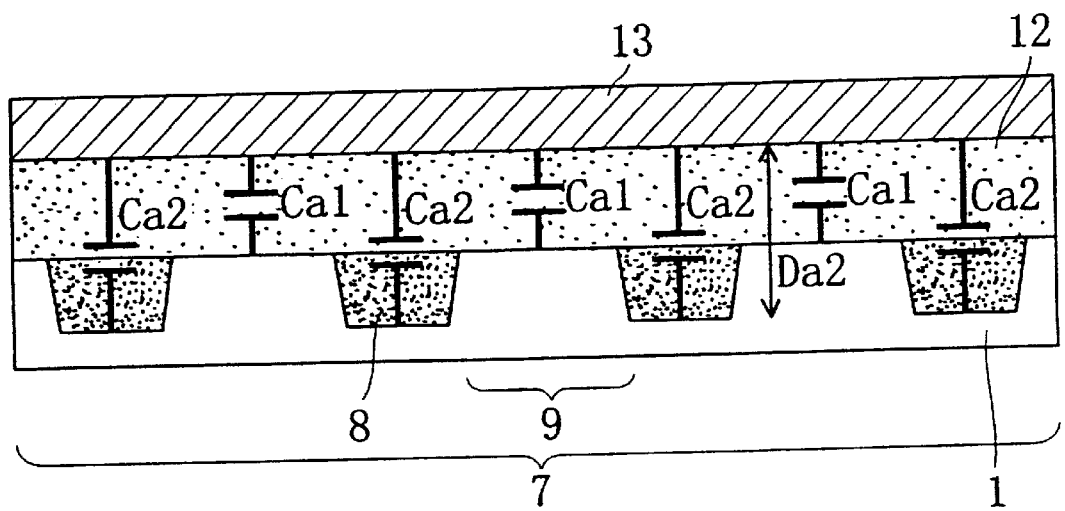
FIG. 21 is a cross-sectional view for illustrating the wiring-to-substrate capacitance in each of a conventional trench-isolated semiconductor device and a conventional LOCOS-isolated semiconductor device.
Figure 21B:
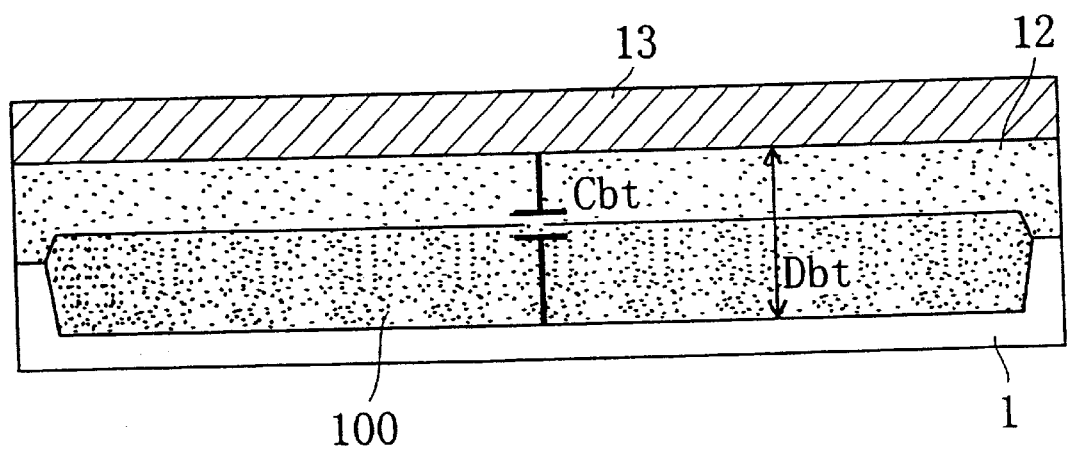

FIG. 1(b) is a cross-sectional view for illustrating the wiring-to-substrate capacitance in the isolation region 7 of the semiconductor device according to the present embodiment. As shown in the drawing, the wiring-to-substrate capacitance of the semiconductor device according to the present embodiment includes the components of capacitances Ca1 and Ca2, similarly to the wiring-to-substrate capacitance of the conventional semiconductor device shown in FIG. 21(a). Moreover, since the PN junction 22 is formed in each of the semiconductor portions 9, another capacitance Cj1 is added in series to the capacitance Ca1. Hence, the total wiring-to-substrate capacitance Cjt is represented by the following equation (3):

$$Cjt = \Sigma\{(Ca1 \times Cj1)/(Ca1+Cj1)\} + \Sigma Ca2 \quad (3),$$

which is smaller than the total capacitance Cat represented by the equation (1). Accordingly, the following inequality (4) is satisfied (4):

$$Cjt < Cat \quad (4).$$

Thus, the wiring-to-substrate capacitance can be reduced in the semiconductor device according to the present embodiment owing to the PN junction 22 present in each of the dummy semiconductor portions 9 of the isolation region 7, which increases the operating speed of the semiconductor device.

A description will be given next to a method of manufacturing a semiconductor device according to the present embodiment. FIGS. 2(a) to 2(g) are cross-sectional views showing the structure of the semiconductor device having the NMOSFET according to the present embodiment in the manufacturing process therefor.

In the step shown in FIG. 2(a), the thin silicon oxide film 21 having a thickness of 10 nm and a silicon nitride film 22 are formed sequentially on the P-type silicon substrate 1.

In the step shown in FIG. 2(b), the plurality of trenches 14 each having a given width are formed in the silicon substrate 1. The trenches 14 include: trenches 14a formed to surround the active region 6 to be formed with the element; trenches 14b formed in the isolation region 7 separated from the active 6 region by the trenches 14a to eliminate pattern dependence from planarity obtained at the completion of the manufacturing process; and trenches 14c for forming the polysilicon wires. In the isolation region 7 also, the semiconductor portions 9 have been provided to form at least one projecting portion surrounded by the trenches 14. The semiconductor portions 9 may be considered as dummy active regions which do not function as active regions. The trenches include one formed in a position immediately under the polysilicon wire 10, which is to be formed in the subsequent step.

In the step shown in FIG. 2(c), a silicon oxide film 23 is deposited over the entire surface of the substrate to fill in the trenches 14.

In the step shown in FIG. 2(d), the silicon oxide film 23 is polished by a CMP method. Subsequently, the silicon nitride film 22 and the silicon oxide film 21 are removed selectively to form the plurality of buried trench portions 8 each filled with the silicon oxide film and having a planarized surface. The buried trench portions 8 include: buried trench portions 8a functioning as isolation; buried trench portions 8b forming the dummy semiconductor portions 9; and buried trench portions 8c for providing insulation between the polysilicon wires and the silicon substrate.

In the step shown in FIG. 2(e), there are formed the gate oxide film 2, the gate electrode 4 having sidewalls 24 on the side faces thereof, and the polysilicon wires 10 by using a known technique. The gate electrode 4 and the polysilicon wires 10 can be formed simultaneously by using a common mask.

In the step shown in FIG. 2(f), arsenic ions 25 are implanted not only into the active region 6 but also into the entire isolation region 7. As a result, the NMOSFET having the source/drain regions 5 is formed in the active region 6. On the other hand, an N-type impurity diffusion layer 31 is formed in each of the dummy semiconductor portions 6 of the isolation region 7, resulting in a PN junction 32 formed between the N-type impurity diffusion layer 31 and the P-type silicon substrate 1. The present embodiment is characterized in that the PN junction 32 is positioned between the top and bottom faces of the buried trench portions 8.

In the step shown in FIG. 2(g), the silicon oxide film is deposited to form the interlayer insulating film 12, followed by the metal wire 13 formed thereon.

In the case of providing the MOSFET in the active region as provided in accordance with the manufacturing method of the present embodiment, the PN junction 22 in each of the semiconductor portions 9 can be formed easily through the implantation of ions for forming the source/drain regions 5, so that manufacturing cost is not increased.

Although the present embodiment has described the case of using the P-type silicon substrate, it will be appreciated that the same effects as achieved in the present embodiment are also achieved in the case of using an N-type silicon substrate by introducing a P-type impurity into the upper portions of the semiconductor portions located between the individual trench portions and thereby forming the PN junctions between the resulting P-type impurity diffusion layers and the N-type silicon substrate.

Although the formation of the PN junctions 32 in the dummy semiconductor portions 9 of the isolation region 7 has been performed simultaneously with the formation of the source/drain regions 5 in the manufacturing method of the present embodiment, the formation of the dummy semiconductor portions 9 may be preformed at any stage of the process of manufacturing the semiconductor device, provided that the PN junctions can be formed in the dummy semiconductor portions.

(Second Embodiment)

Figure 3:
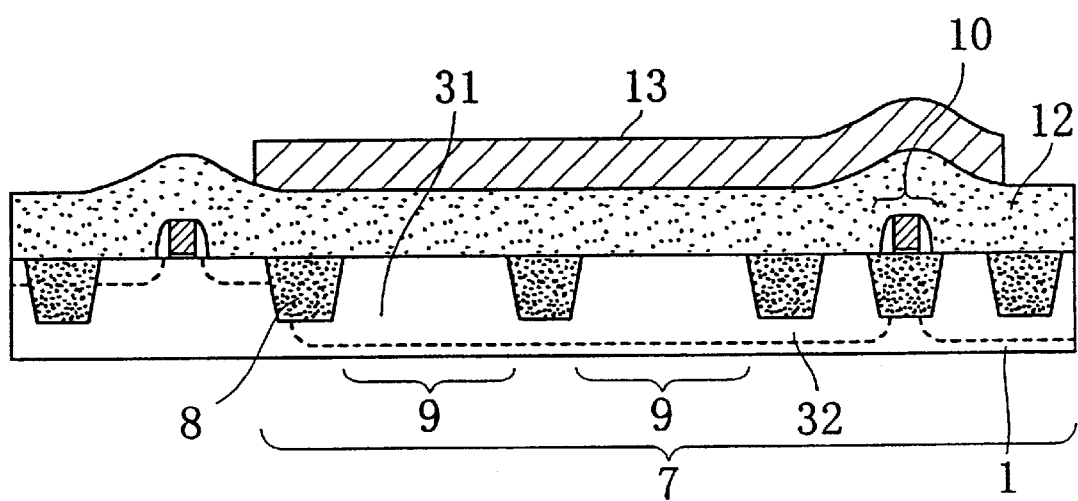
FIG. 3 is a cross-sectional view of a semiconductor device according to a second embodiment, having shallow PN junctions formed in the semiconductor portions thereof.

FIG. 3 is a cross-sectional view of a semiconductor device according to a second embodiment.

As shown in the drawing, a first active region 6 of a P-type silicon substrate 1 is provided with an element functioning as a MOSFET-composed of: a gate oxide film 2; a gate electrode 4 made of a polysilicon film; and source/drain regions 5. An isolation region 7 for electrically isolating the individual elements is formed with a plurality of trench portions 8 each filled with a silicon oxide film as an insulating material and with dummy semiconductor portions 9 provided between the individual trench portions 8 and not serving as active regions. On one of the trench portions 8 formed in the isolation region 7, there is provided a polysilicon wire 10 formed simultaneously with the gate insulating film 2 and the gate electrode 4. There are further provided an interlayer insulating film 12 made of a silicon oxide film deposited over the entire surface of the substrate and a metal wire 13 formed on the interlayer insulating film 12.

Each of the semiconductor portions 9 formed in the isolation region 7 is provided with an impurity diffusion layer 31 in to which an N-type impurity of the conductivity type opposite to that of the impurity introduced into the silicon substrate 1 has been introduced, so that a PN junction 32 is formed between the impurity diffusion layer 31 and the silicon substrate 1. The PN junction 32 is positioned at a level lower than the bottom faces of the trench portions 8.

The wiring-to-substrate capacitance in the isolation region 7 of the present embodiment is represented by the following equation (5):

$$Cjt = \Sigma\{(Ca1 \times Cj1)/(Ca1+Cj1)\} + \Sigma\{(Ca2 \times Ck1)/(Ca2+Ck1)\} \quad (5),$$

which is smaller than the total capacitance Cat represented by the equation (1). In the foregoing equation (5), Ck1 represents the capacitance between the bottom face of the trench portion 8 and the PN junction 32. Hence, the following inequality (6) is satisfied, similarly to the first embodiment:

$$Cjt < Cat \quad (6).$$

Thus, the wiring-to-substrate capacitance can also be reduced in the semiconductor device according to the present embodiment since the PN junction 32 is present in each of the dummy semiconductor portions 9 of the isolation region 7, similarly to the first embodiment, so that the operating speed of the semiconductor device is increased. In particular, the present embodiment can reduce the wiring-to-substrate capacitance in the entire isolation region containing not only the semiconductor portions 9 but also the trench portions, so that the effect of increasing the operating speed is remarkable.

Although it is difficult to form the PN junction 32 as formed in the present embodiment through the implantation of impurity ions for forming the source/drain regions of the MOSFET, the impurity concentration and the depth of ionic penetration into the substrate can be controlled arbitrarily, so that a higher effect of reducing the capacitance is achieved. In particular, since the PN junction 32 is positioned at a level lower than the bottom faces of the trench portions 8, a higher effect of reducing the capacitance is achieved.

Although the present embodiment has described the case of using the P-type silicon substrate, an N-type silicon substrate may also be used instead. In this case, a PN junction can be formed by introducing a P-type impurity into the semiconductor portions and thereby forming an impurity diffusion layer, so that the same effects as achieved in the present embodiment are achieved.

(Third Embodiment)

Figure 4:
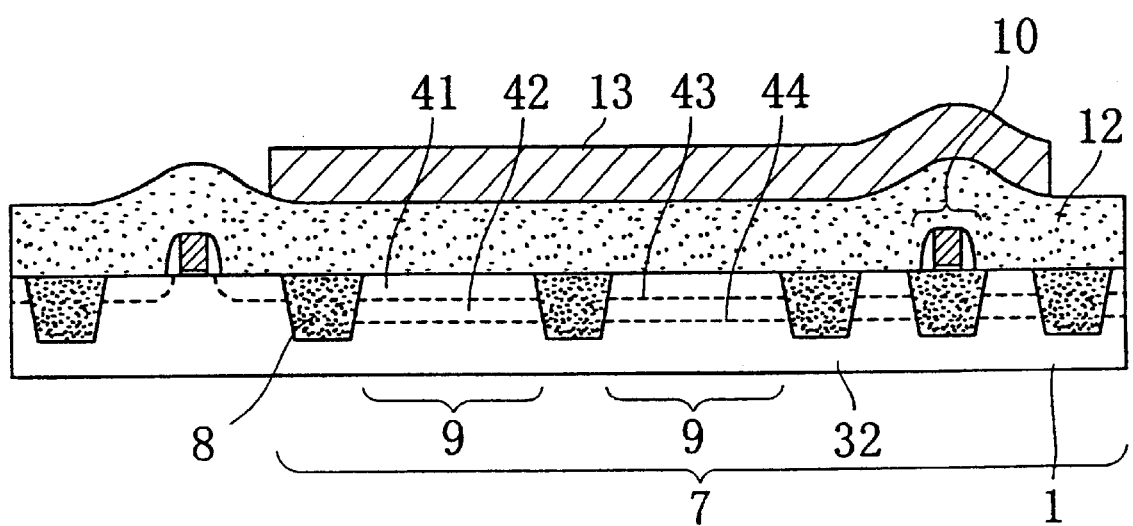
FIG. 4 is a cross-sectional view of a semiconductor device according to a third embodiment, having two PN junctions in the semiconductor portions thereof.

FIG. 4 is a cross-sectional view of a semiconductor device according to a third embodiment.

As shown in the drawing, a first active region 6 of a P-type silicon substrate 1 is provided with an element functioning as a MOSFET composed of: a gate oxide film 2; a gate electrode 4 made of a polysilicon film; and source/drain regions 5. An isolation region 7 for electrically isolating the individual elements is formed with a plurality of trench portions 8 filled with a silicon oxide film as an insulating material and with dummy semiconductor portions 9 provided between the individual trench portions 8 and not serving as active regions. On one of the trench portions 8 formed in the isolation region 7, there is provided a polysilicon wire 10 formed simultaneously with the gate insulating film 2 and the gate electrode 4. There are further provided an interlayer insulating film 12 made of a silicon oxide film deposited over the entire surface of the substrate and a metal wire 13 formed on the interlayer insulating film 12.

Each of the dummy semiconductor portions 9 formed in the isolation region 7 is provided with a P-type impurity diffusion layer 41 and an N-type impurity diffusion layer 42, which are arranged in this order from the surface of the silicon substrate. As a result, a first PN junction 43 is formed between the P-type impurity diffusion layer 41 and the N-type impurity diffusion layer 42, while a second PN junction 44 is formed between the N-type impurity diffusion layer 42 and the P-type silicon substrate 1. The first and second PN junctions 43 and 44 are positioned at levels between the top and bottom faces of the trench portions 8.

If respective junction capacitances in the P-type and N-type impurity diffusion layers 41 and 42 are designated at Cj1 and Cj2, a total wiring-to-substrate capacitance Cjt in the semiconductor device according to the present embodiment is represented by the following equation (7):

$$Cjt=\Sigma\{1/[(1/Ca1)+(1/Cj1)+(1/Cj2)]\}+\Sigma Ca2 \quad (7)$$

which is smaller than the total capacitance Cat of the semiconductor device according to the first embodiment represented by the equation (1). Hence, the following equation (8) is satisfied:

$$Cjt<Cat \quad (8).$$

Since the present embodiment has provided the plurality of PN junctions 43 and 44 in the respective dummy semiconductor portions of the isolation region 7, the capacitance component of the wiring-to-substrate capacitance in the region containing the semiconductor portions 9 of the semiconductor device can be represented by the capacitance obtained by connecting in series the respective capacitances in the P-type and N-type impurity diffusion layers 41 and 42 to the capacitance in the interlayer insulating film. Consequently, the wiring-to-substrate capacitance of the semiconductor device can further be reduced than in the first embodiment, resulting in the semiconductor device operating at a higher speed.

Although the present embodiment has described the case where the two PN junctions 43 and 44 are formed of the two impurity diffusion layers, if three or more PN junctions are formed of three or more impurity diffusion layers, the total wiring-to-substrate capacitance can be represented in the same fashion as represented by the equation (7). For example, if m PN junctions (m is an integer equal to or more than 3) are formed in each of the dummy active regions 9 and n PN junctions (n is an integer equal to or more than 3) are formed immediately under the trench portion 8, the total wiring-to-substrate capacitance Cjt is represented by the following equation (9):

$$Cjt=\Sigma\{1/[(1/Ca1)+\Sigma(1/Cjm)]\}+\Sigma\{1/[(1/Ca2)+\Sigma(1/Cjn)]\} \quad (9),$$

which is smaller than the total capacitance Cat represented by the equation (1). Hence, the following inequality (10) is satisfied:

$$Cjt<Cat \quad (10).$$

In the case of using the structure, the wiring-to-substrate capacitance can be reduced significantly since not only the capacitance component in the region containing the semiconductor portions of the isolation region 7 but also the capacitance component in the region containing the trench portions thereof is also reduced.

(Fourth Embodiment)

Figure 5:
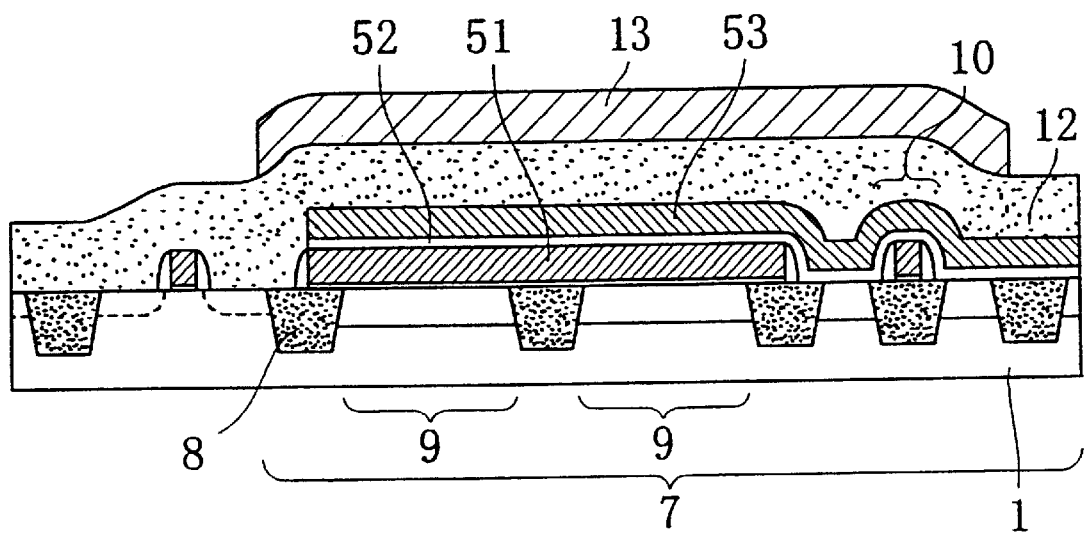
FIG. 5 is a cross-sectional view of a semiconductor device according to a fourth embodiment, having a high resistor film formed on the semiconductor portions thereof.

FIG. 5 is a cross-sectional view of a semiconductor device according to a fourth embodiment.

As shown in the drawing, a first active region 6 of a P-type silicon substrate 1 is provided with an element functioning as a MOSFET composed of: a gate oxide film 2; a gate electrode 4 made of a polysilicon film; and source/drain regions 5. An isolation region 7 for electrically isolating the individual elements is formed with a plurality of trench portions 8 each filled with a silicon oxide film as an insulating material and with dummy semiconductor portions 9 provided between the individual trench portions 8 and not serving as active regions. On one of the trench portions 8 formed in the isolation region 7, there is provided a polysilicon wire 10 formed simultaneously with the gate insulating film 2 and the gate electrode 4. In addition, a dummy gate 51 composed of a polysilicon film formed simultaneously with the gate electrode 4 extends continuously over the semiconductor portions 9 and trench portions 8. Over the dummy gate 51, the polysilicon wire 10, and a surface of the silicon substrate (except for the active region), a silicon oxide film 52 and a high resistor film 53 composed of a polysilicon film are further formed in layers. The dummy gate 51 has been formed by patterning a first-layer polysilicon film used commonly to form the gate electrode 4 and the polysilicon wire 10 so that it is at a given distance from each of the gate electrode 4 and the polysilicon wire 10. The polysilicon film composing the high resistor film 53 has a sheet resistance film higher than that of the first-layer polysilicon film composing the gate electrode 4 and the like and an impurity concentration of $1\times10^{20}$ cm$^{-3}$ or less. The sheet resistance of the dummy gate 51 can also be held high by covering the isolation region with a resist film or the like during the implantation of an impurity into the active region.

In the semiconductor device according to the present embodiment, it is sufficient to consider the capacitance between the wiring and high resistor film instead of the capacitance between the wiring and substrate. In this case, since the resistance of the polysilicon film composing the high resistor film 53 is high, a voltage drop occurs between the top face of the high resistor film 53 and the surface of the semiconductor substrate 1. Accordingly, the voltage applied to the top and bottom faces of the interlayer insulating film is reduced, though the capacitance of the interlayer insulating film 12 remains unchanged. Since the amount of charge accumulated in the top and bottom faces of the interlayer insulating film 12 decreases in direct proportion to the voltage applied thereto, the time required for charging or discharging between the wiring and high resistor is reduced, resulting in the semiconductor device operating at a higher speed.

A description will be given next to a method of manufacturing a semiconductor device according to the present embodiment. FIGS. 6(a) to 6(h) are cross-sectional views showing the structure of the semiconductor device having an NMOSFET according to the present embodiment in the manufacturing process therefor.

Figure 6A:
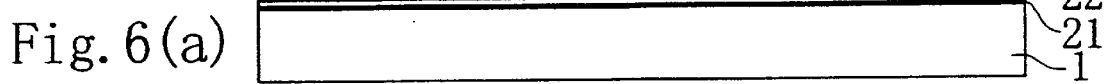
FIGS. 6(a) to 6(h) are cross-sectional views illustrating a process of manufacturing a semiconductor device according to a fourth embodiment.

In the step shown in FIG. 6(a), a thin silicon oxide film 21 having a thickness of 10 nm and a silicon nitride film 22 are formed sequentially on the P-type silicon substrate 1.

Figure 6B:
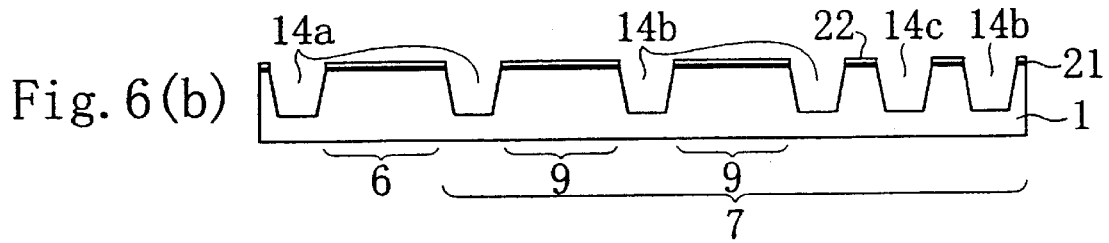

In the step shown in FIG. 6(b), a plurality of trenches 14 each having a given width are formed in the silicon substrate 1. The trenches 14 include: trenches 14a formed to surround the active region 6 to be formed with the element; trenches 14b formed in the isolation region 7 separated from the active region 6 by the trenches 14a to eliminate pattern dependence from planarity obtained at the completion of the manufacturing process; and trenches 14c for forming the polysilicon wires. In the isolation region 7 also, the semiconductor portions 9 have been provided to form at least one projecting portion surrounded by the trenches 14. The semiconductor portions 9 may be considered as dummy active regions which do not function as active regions. The trenches include one formed in a position immediately under the polysilicon wire 10, which is to be formed in the subsequent step.

Figure 6C:
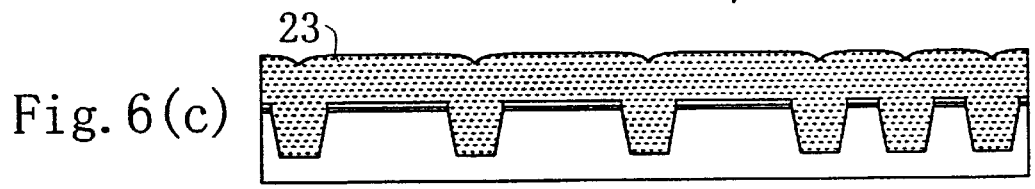

In the step shown in FIG. 6(c), a silicon oxide film 23 is deposited over the entire surface of the substrate to fill in the trenches 14.

Figure 6D:
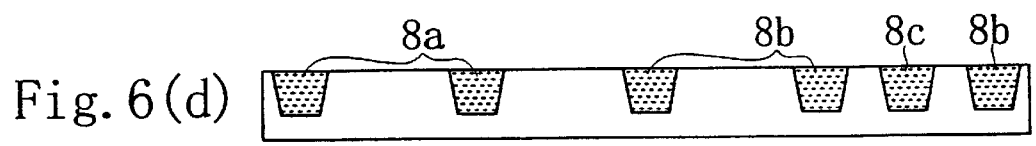

In the step shown in FIG. 6(d), the silicon oxide film 23 is polished by a CMP process. Subsequently, the silicon nitride film 22 and the silicon oxide film 21 are removed selectively to form a plurality of buried trench portions 8 each filled with a silicon oxide film and having a planarized surface. The buried trench portions 8 include: buried trench portions 8a functioning as isolation; buried trench portions 8b forming the dummy semiconductor portions 9; and buried trench portions 8c for providing insulation between the polysilicon wires and the silicon substrate.

Figure 6E:
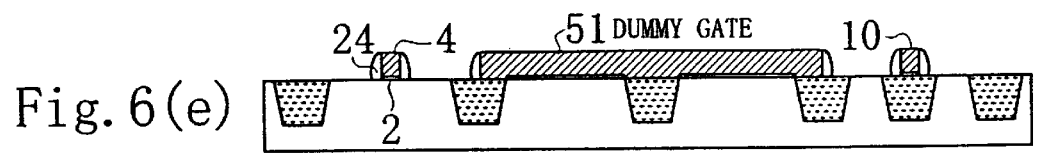

In the step shown in FIG. 6(e), there are formed the gate oxide film 2, the gate electrode 4 having sidewalls 24 on the side faces thereof, and the polysilicon wires 10 by using a known technique. During the process, the dummy gate 51 is formed simultaneously with the gate electrode 4 and the polysilicon wire 10 and at a given distance from each of the gate electrode 4 and the polysilicon wire 10, so that the dummy gate 51 neither cross nor contact the gate electrode 4 and the polysilicon wire 10. The gate electrode 4, the polysilicon wire 10, and the dummy gate 51 can be formed simultaneously by using a common semiconductor mask. The dummy gate 51 has a sheet resistance higher than those of the gate electrode 4 and polysilicon wire 10, which are used as interconnections, and has an impurity concentration adjusted to be $1\times10^{20}$ atoms·cm$^{-3}$ or lower by ion implantation or the like.

Figure 6F:
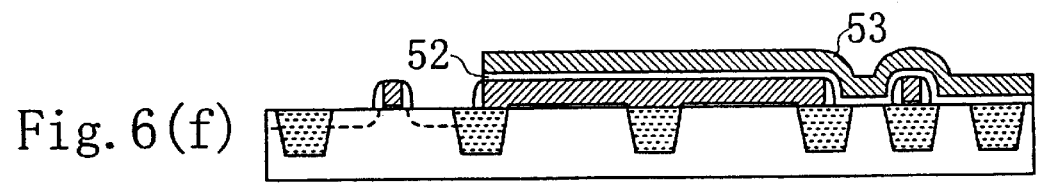

In the step shown in FIG. 6(f), the silicon oxide film 52 and the high resistor film 53 made of polysilicon are formed over the isolation region 7. The high resistor film 53 has a sheet resistance higher than those of the gate electrode 4 and polysilicon wires 10 and has an impurity concentration adjusted to be $1\times10^{20}$ atoms·cm$^{-3}$ or lower by ion implantation or the like. The silicon oxide film 52 and the high resistor film 53 are formed to provide a MIM capacitor and a resistor.

Figure 6G:
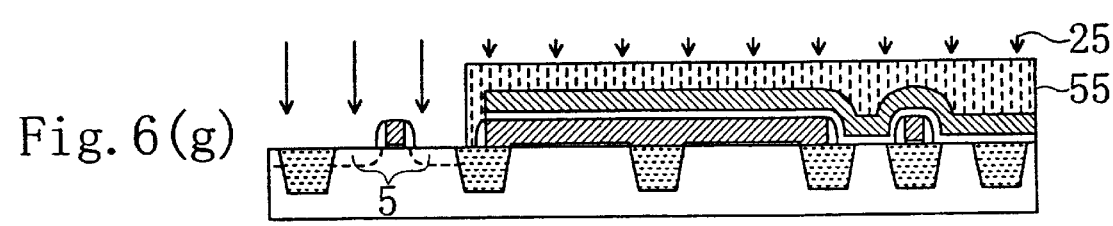

In the step shown in FIG. 6(g), a resist mask 55 covering at least the isolation region 7 is formed and arsenic ions 25 are implanted into the active region 6 to form the NMOS having the source/drain regions 5. During the process, arsenic ions are not implanted in the isolation region 7.

Figure 6H:
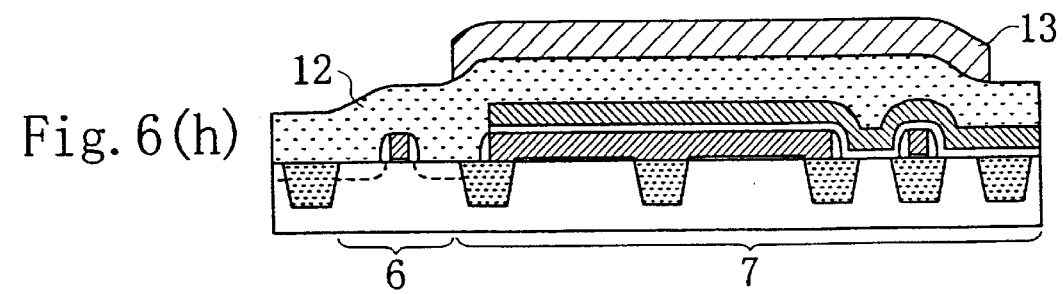

In the step shown in FIG. 6(h), a silicon oxide film is deposited to form the interlayer insulating film 12, followed by a metal wire 13 formed thereon.

In the semiconductor device according to the present embodiment, it is sufficient to consider the capacitance between the wiring and high resistor film instead of the capacitance between the wiring and substrate. In this case, since the resistance of the polysilicon film composing the high resistor film 53 is high, a voltage drop occurs between the top face of the high resistor film 53 and the surface of the semiconductor substrate 1. Accordingly, the voltage applied to the top and bottom faces of the interlayer insulating film is reduced, though the capacitance of the interlayer insulating film 12 remains unchanged. Since the amount of charge accumulated in the top and bottom faces of the interlayer insulating film 12 decreases in direct proportion to the voltage applied thereto, the time required for charging or discharging between the wiring and high resistor is reduced, resulting in the semiconductor device operating at a higher speed.

The high-resistance film 53 according to the present embodiment can be formed easily at low cost by patterning the same film as composing, e.g., the high resistor film of the resistor element and local wiring. Instead of forming the dummy gate 51, it is possible to form films corresponding to the high resistor film 53, the silicon oxide film 52, and the dummy gate 51 from three films composing the upper-layer film, capacitor insulating film, and lower-layer film composing the MIM capacitor formed anywhere on the semiconductor substrate.

It is also possible to increase the operating speed of the semiconductor device by reducing the time required for charging or discharging without forming either of the dummy gate 51 and the high resistor film 53 as well as the silicon oxide film 52.

Although the description has been given to the case where the high resistor film 53 composed of the polysilicon film and the silicon oxide film 52 are stacked in layers on the isolation region 7, similar effects can also be achieved in the case of using an amorphous silicon film or a silicon nitride film instead of the polysilicon film. In particular, the use of an insulating film composed of a silicon oxide film allows a reduction in total capacitance and a further increase in the operating speed of the semiconductor device.

(Fifth Embodiment)

Figure 7:
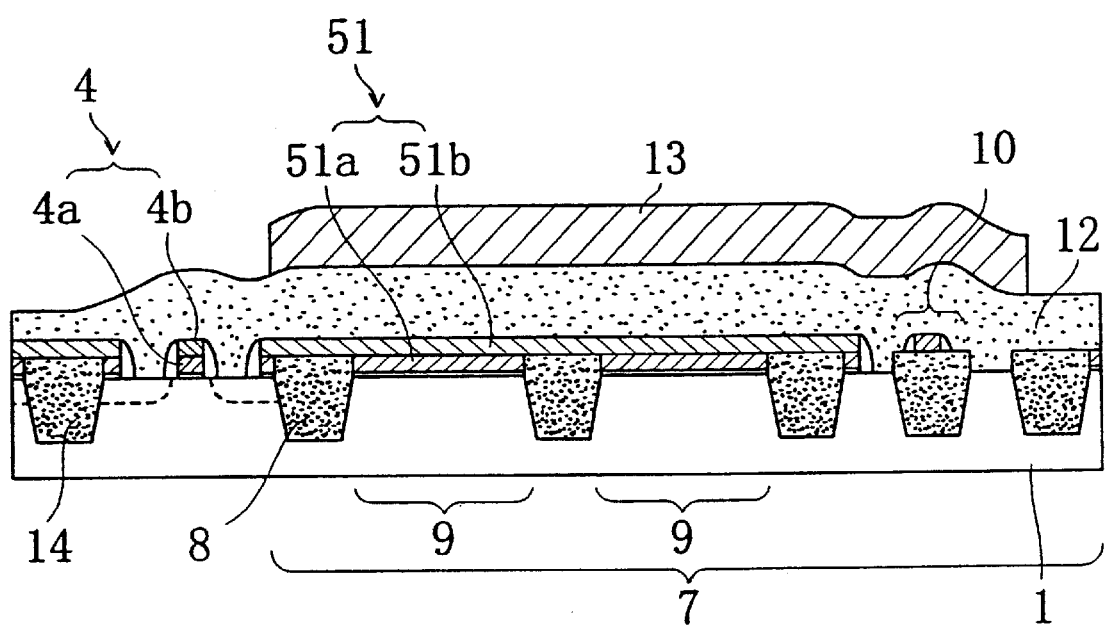
FIG. 7 is a cross-sectional view of a semiconductor device according to a fifth embodiment, having a multilayer gate provided therein.

FIG. 7 is a cross-sectional view of a semiconductor device according to a fifth embodiment.

As shown in the drawing, an active region 6 of a P-type silicon substrate 1 is provided with an element functioning as a MOSFET composed of: a gate oxide film 2; a gate electrode 4; and source/drain regions 5. An isolation region 7 for electrically isolating the individual elements is formed with a plurality of trench portions 8 each filled with a silicon oxide film as an insulating material and with dummy semiconductor portions 9 provided between the individual trench portions 8 and not serving as active regions. On one of the trench portions 8 formed in the isolation region 7, there is provided a polysilicon wire 10 formed simultaneously with the gate electrode 4.

In the present embodiment, the gate electrode 4 consists of a lower-layer portion 4a made of a first conductor film composed of a polysilicon film or the like and an upper-layer portion 4b made of a second conductor film composed of a tungsten film or the like. In the isolation region 7, there is provided a dummy gate 51 consisting of a lower-layer portion 51a composed of the same first conductor film as composing the lower-layer portion 4a of the gate electrode 4 and an upper-layer portion 51b composed of the same second conductor film composing the upper-layer portion 4b of the gate electrode 4. The lower-layer portion 51a of the dummy gate 51 has a top surface at the same level as the top face of each of the trench portions 8, so that planarization is achieved between the lower-layer portion 51a and the trench portions 8. The polysilicon wire 10 is composed only of the second conductor film composing the upper-layer portion 4b of the gate electrode 4. The dummy gate 51 has been formed at a given distance from each of the gate electrode 4 and polysilicon wire 10 so as to improve pattern accuracy in a photolithographic process in accordance with a line-and-space relationship. There are also provided an interlayer insulating film 12 composed of a silicon oxide film deposited over the entire surface of the substrate and a metal wire 13 formed on the interlayer insulating film 12.

In accordance with a process of manufacturing the semiconductor device according to the present embodiment, the structure of the semiconductor device as shown in FIG. 7 can be implemented by the following procedure, though the drawing thereof is omitted here.

First, the gate insulating film and the first conductor film composed of a polysilicon film or the like are deposited on the semiconductor substrate, which are partially opened to form trenches. Thereafter, an insulating film is deposited on the substrate to fill in the trenches for planarization, thereby forming trench portions. Subsequently, the second conductor film of tungsten or the like is deposited on the planarized substrate and patterned to form the gate electrode 4, the dummy gate 51, and the polysilicon wires 10. After that, the interlayer insulating film 12 and the metal wire 13 can be formed by a well-known method.

In the present embodiment also, the operating speed can be increased by reducing the amount of charge accumulated in the top and bottom faces of the interlayer insulating film, similarly to the fourth embodiment. In the semiconductor device having such a structure as used in the present embodiment, the upper-layer portion 4b of the gate electrode 4 is typically composed of a low resistor film composed of silicide or the like. However, since the wiring-to-substrate voltage is also applied in series to the upper-layer and lower-layer portions 4b and 4a, the amount of charge is effectively reduced by a voltage drop and the operating speed of the semiconductor device is increased remarkably.

Although the present embodiment has not used such a high resistor film as used in the fourth embodiment, it will be appreciated that a high resistor film may be provided over the dummy gate with an insulating film interposed therebetween.

(Sixth Embodiment)

Figure 8:
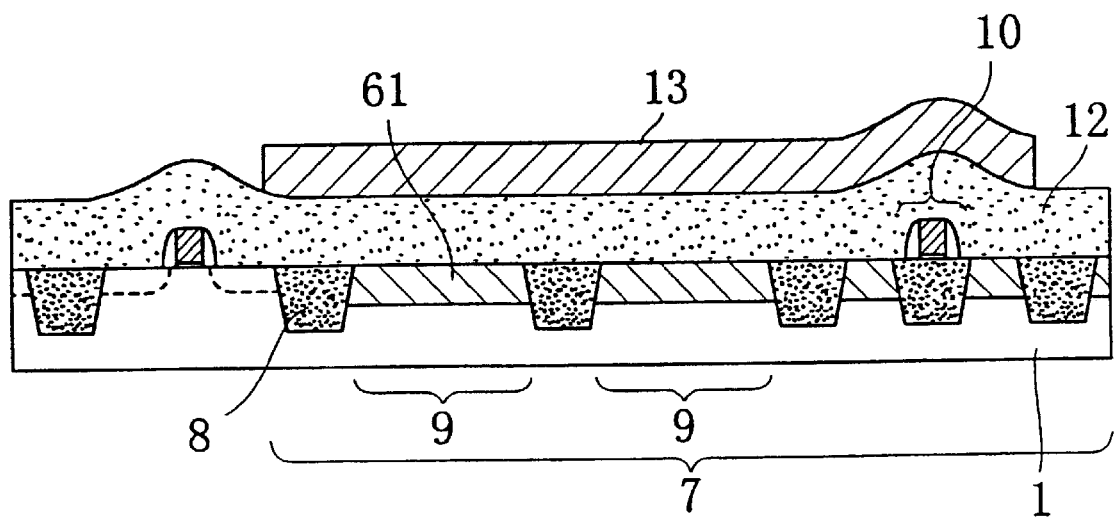
FIG. 8 is a cross-sectional view of a semiconductor device according to an eighth embodiment, having an inter-trench film formed on each of the semiconductor portions thereof.

FIG. 8 is a cross-sectional view of a semiconductor device according to a sixth embodiment.

As shown in the drawing, an active region 6 of a P-type silicon substrate 1 is provided with an element functioning as a MOSFET composed of: a gate oxide film 2; a gate electrode 4 made of a polysilicon film; and source/drain regions 5. An isolation region 7 for electrically isolating the individual elements is formed with a plurality of trench portions 8 each filled with a silicon oxide film as an insulating material and with dummy semiconductor portions 9 provided between the individual trench portions 8 and not serving as active regions. On one of the trench portions 8 formed in the isolation region 7, there is provided a polysilicon wire 10 formed simultaneously with the gate insulating film 2 and the gate electrode 4. There are further provided an interlayer insulating film 12 made of a silicon oxide film deposited over the entire surface of the substrate and a metal wire 13 formed on the interlayer insulating film 12.

In the isolation region 7, inter-trench insulating films 61 each composed of a silicon oxide film and surrounded by the trench portions 8 are formed to overlie the dummy semiconductor portions 9 and underlie the interlayer insulating film 12. The top faces of the inter-trench insulating films 61 are at the same level as the top faces of the buried trench portions 8, while the bottom faces thereof are at a level between the top and bottom faces of the buried trench portions 8.

A description will be given next to a method of manufacturing a semiconductor device according to the present embodiment. FIGS. 9(a) to 9(i) are cross-sectional views showing the structure of the semiconductor device having an NMOSFET according to the present embodiment in the manufacturing process therefor.

Figure 9:
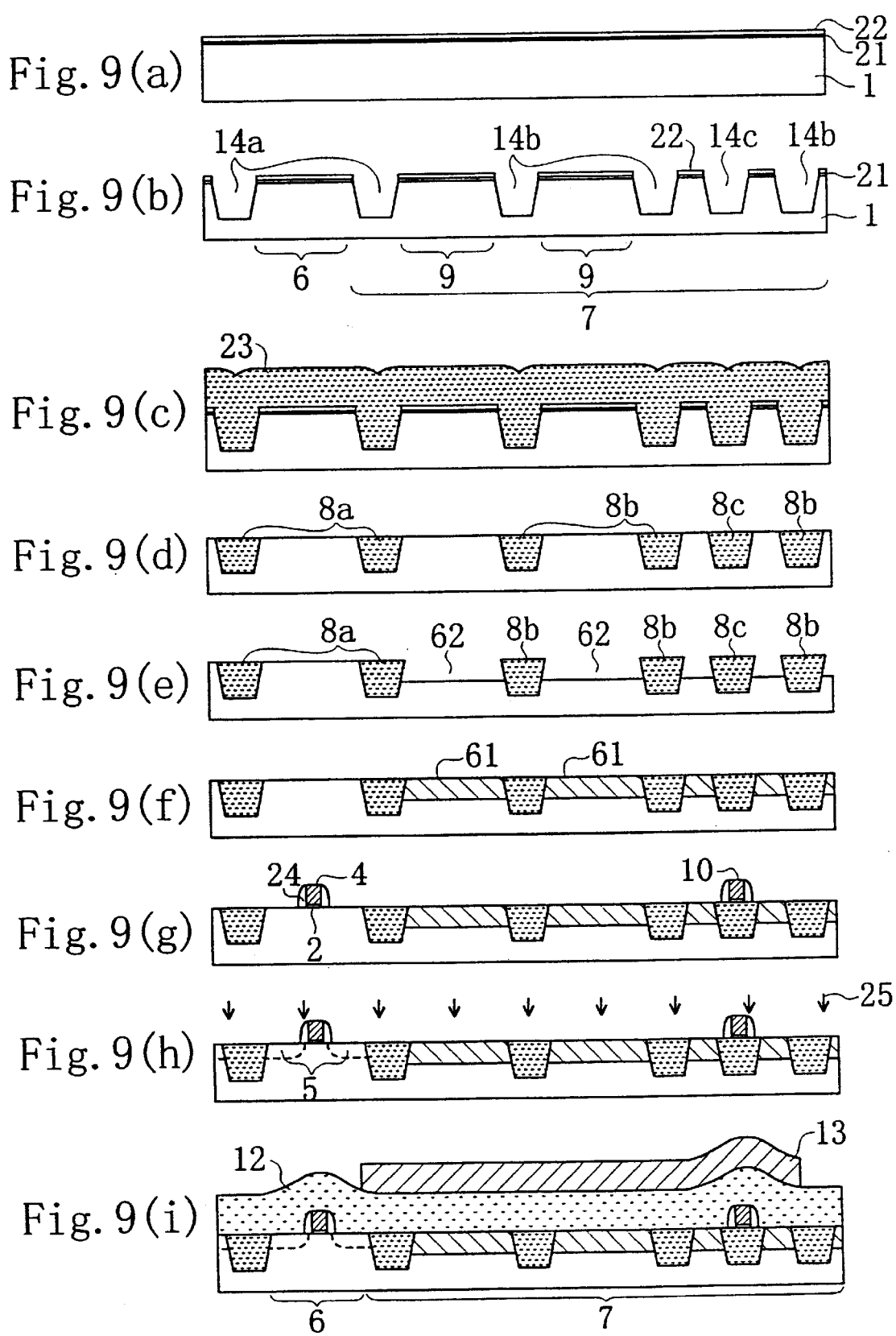
FIGS. 9(a) to 9(i) are cross-sectional views illustrating a process of manufacturing the semiconductor device according to the sixth embodiment.

In the step shown in FIG. 9(a), a thin silicon oxide film 21 having a thickness of 10 nm and a silicon nitride film 22 are formed sequentially on the P-type silicon substrate 1.

In the step shown in FIG. 9(b), a plurality of trenches 14 each having a given width are formed in the silicon substrate 1. The trenches 14 include: trenches 14a formed to surround the active region 6 to be formed with the element; trenches 14b formed in the isolation region 7 separated from the active region 6 by the trenches 14a to eliminate pattern dependence from planarity obtained at the completion of the manufacturing process; and trenches 14c for forming the polysilicon wires. In the isolation region 7 also, the semiconductor portions 9 have been provided to form at least one projecting portion surrounded by the trenches 14. The semiconductor portions 9 may be considered as dummy active regions which do not function as active regions. The trenches include one formed in a position immediately under the polysilicon wire 10, which is to be formed in the subsequent step.

In the step shown in FIG. 9(c), a silicon oxide film 23 is deposited over the entire surface of the substrate to fill in the trenches 14.

In the step shown in FIG. 9(d), the silicon oxide film 23 is polished by a CMP method. Subsequently, the silicon nitride film 22 and the silicon oxide film 21 are removed selectively to form the plurality of buried trench portions 8 each filled with the silicon oxide film and having a planarized surface. The buried trench portions 8 include: buried trench portions 8a functioning as isolation; buried trench portions 8b forming the dummy semiconductor portions 9; and buried trench portions 8c for providing insulation between the polysilicon wires and the silicon substrate.

In the step shown in FIG. 9(e), the semiconductor portions of the isolation region 7 are subjected to dry etching for forming trenches 62.

In the step shown in FIG. 9(f), a silicon oxide film is filled in each of the trenches 62 to form the inter-trench insulating film 61.

In the step shown in FIG. 9(g), there are formed the gate oxide film 2, the gate electrode 4 having sidewalls 24 on the side faces thereof, and the polysilicon wire 10 by using a known technique. The gate electrode 4 and the polysilicon wire 10 can be formed simultaneously by using a common semiconductor mask.

In the step shown in FIG. 9(h), arsenic ions 25 are implanted from above to form the NMOSFET having the source/drain regions 5 in the active region 6. Although the arsenic ions 25 are also implanted into the isolation region 25 during the process, no trouble occurs. In the case of using a resist mask covering a region to be formed with a PMOSFET, however, the isolation region 7 may be covered with the resist mask.

In the step shown in FIG. 9(i), a silicon oxide film is deposited to form the interlayer insulating film 12, followed by the metal wire 13 formed thereon.

In the semiconductor device according to the present embodiment, the inter-trench insulating films 61 each composed of the silicon oxide film are formed over the dummy semiconductor portions 9 of the isolation region 7 and under the interlayer insulating film 12 to be surrounded by the buried trench portions 8. The top faces of the inter-trench insulating films 61 are at the same level as the top faces of the buried trench portions 8, while the bottom faces thereof are at a level between the top and bottom faces of the buried trench portions 8.

Figure 19:
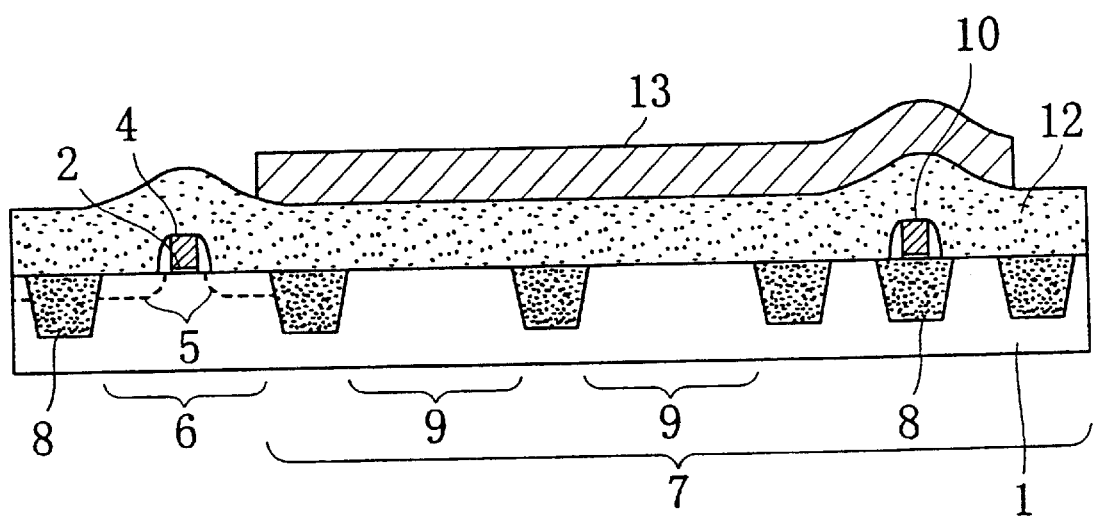
FIG. 19 is a cross-sectional view of a conventional semiconductor device.
Figure 20A:
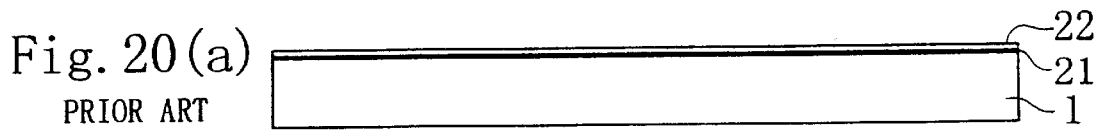
FIGS. 20(a) to 20(g) are cross-sectional views illustrating a process of manufacturing the conventional semiconductor device.
Figure 20B:
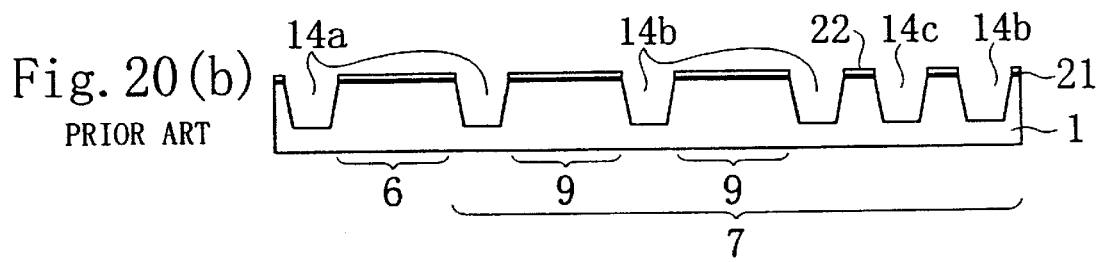
Figure 20C:
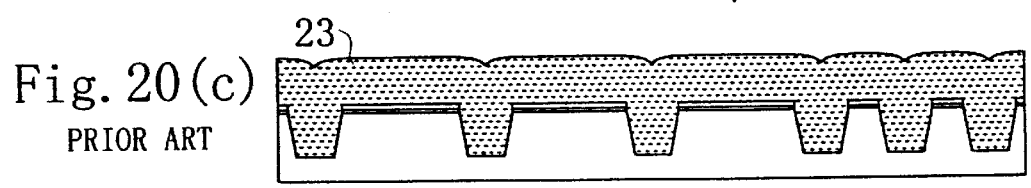
Figure 20D:
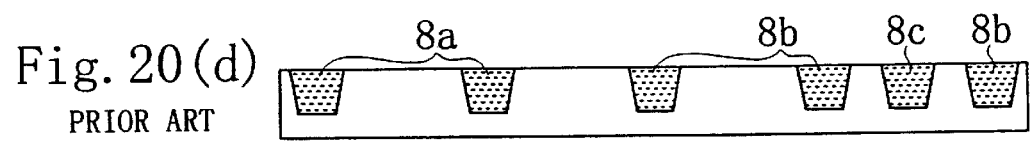
Figure 20E:
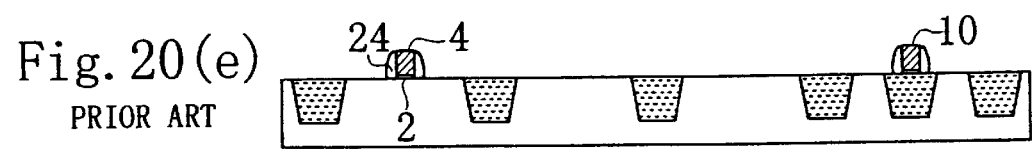
Figure 20F:
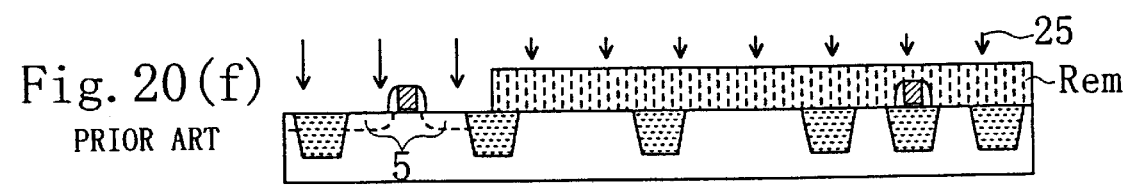
Figure 20G:
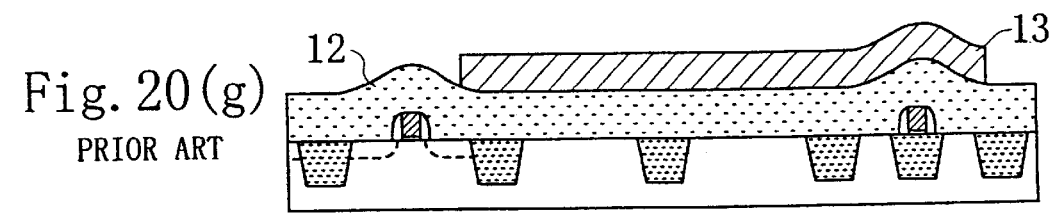

Thus, in the semiconductor device according to the present embodiment, the inter-trench insulating films 61 are formed by filling the silicon oxide films in the respective dummy semiconductor portions 9 that have been lowered in level, so that the distance between the wiring and the substrate is longer than in the conventional semiconductor device shown in FIG. 19. Since the wiring-to-substrate capacitance decreases in inverse proportion to the distance, the wiring-to-substrate capacitance is smaller in the semiconductor device according to the present embodiment than in the conventional semiconductor device, resulting in a higher operating speed.

Although the present embodiment has described the case where the silicon oxide film is buried in each of the semiconductor portions, similar effects can also be achieved if an insulating film composed of a silicon nitride film is used.

Although the semiconductor portions 9 have been lowered in level and filled with the silicon oxide films prior to the formation of the gate electrode, the method of manufacturing a semiconductor device according to the present invention is not limited to such an embodiment. The same effects as achieved in the present embodiment can also be achieved if the steps of lowering the semiconductor portions 9 in level and filling the silicon oxide films therein are performed after the formation of the gate electrode or prior to the formation of trench isolation.

(Seventh Embodiment)

Figure 10:
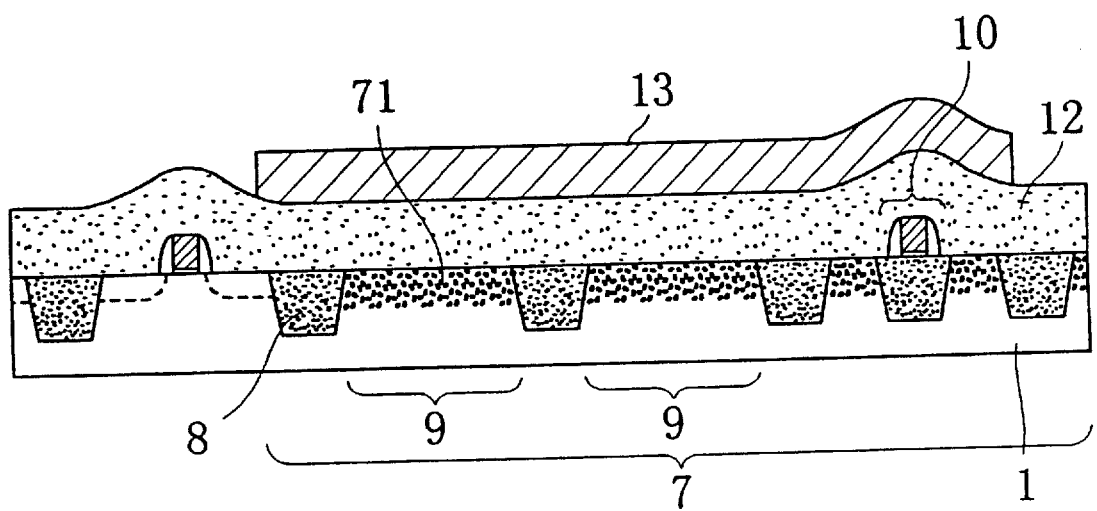
FIG. 10 is a cross-sectional view of a semiconductor device according to a seventh embodiment, having a high resistor portion in the upper portion of each of the semiconductor portions.

FIG. 10 is a cross-sectional view of a semiconductor device according to a seventh embodiment.

As shown in the drawing, an active region 6 of a P-type silicon substrate 1 is provided with an element functioning as a MOSFET composed of: a gate oxide film 2; a gate electrode 4 made of a polysilicon film; and source/drain regions 5. An isolation region 7 for electrically isolating the individual elements is formed with a plurality of trench portions 8 each filled with a silicon oxide film as an insulating material and with dummy semiconductor portions 9 provided between the individual trench portions 8 and not serving as active regions. On one of the trench portions 8 formed in the isolation region 7, there is provided a polysilicon wire 10 formed simultaneously with the gate insulating film 2 and the gate electrode 4. There are further provided an interlayer insulating film 12 made of a silicon oxide film deposited over the entire surface of the substrate and a metal wire 13 formed on the interlayer insulating film 12.

In upper portions of the dummy semiconductor portions 9 of the isolation region 7, oxygen atoms have been introduced by ion implantation or the like to form high resistor portions 71 each composed of a high-resistance silicon layer. Although the bottom faces of the high resistor portions 71 are at a level between the top and bottom faces of the trench portions 8, they may be positioned at a level lower than the bottom faces of the trench portions 8.

A description will be given next to a method of manufacturing a semiconductor device according to the present embodiment. FIGS. 11(a) to 11(h) are cross-sectional views showing the structure of the semiconductor device having an NMOSFET according to the present embodiment in the manufacturing process therefor.

Figure 11A:
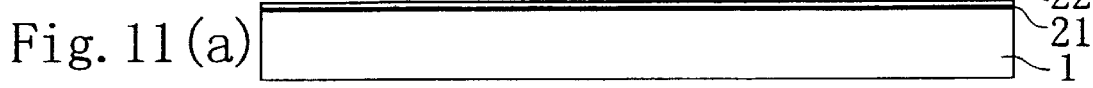
FIGS. 11(a) to 11(h) are cross-sectional views illustrating a process of manufacturing a semiconductor device according to a seventh embodiment.

In the step shown in FIG. 11(a), a thin silicon oxide film 21 having a thickness of 10 nm and a silicon nitride film 22 are formed sequentially on the P-type silicon substrate 1.

Figure 11B:
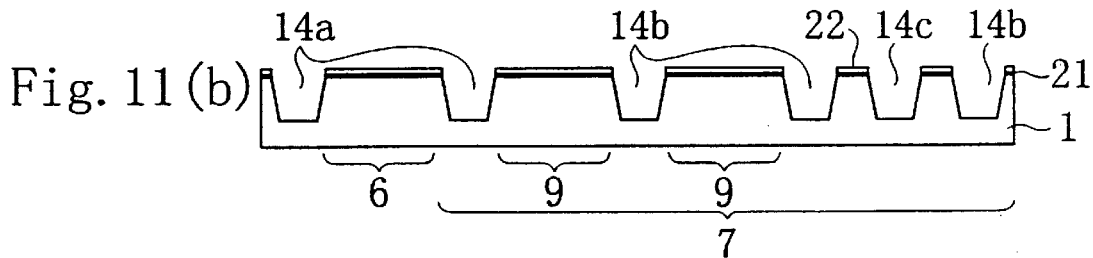

In the step shown in FIG. 11(b), a plurality of trenches 14 each having a given width are formed in the silicon substrate 1. The trenches 14 include: trenches 14a formed to surround the active region 6 to be formed with the element; trenches 14b formed in the isolation region 7 separated from the active region 6 by the trenches 14a to eliminate pattern dependence from planarity obtained at the completion of the manufacturing process; and trenches 14c for forming the polysilicon wires. In the isolation region 7 also, the semiconductor portions 9 have been provided to form at least one projecting portion surrounded by the trenches 14. The semiconductor portions 9 may be considered as dummy active regions which do not function as active regions. The trenches include one formed in a position immediately under the polysilicon wire 10, which is to be formed in the subsequent step.

Figure 11C:
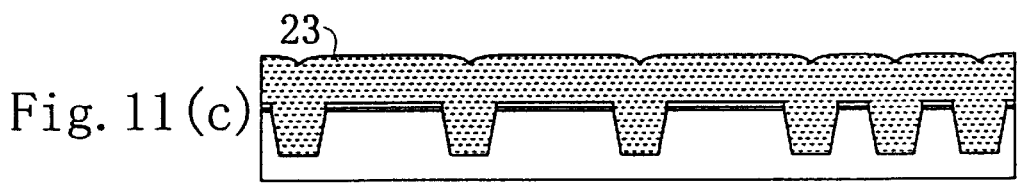

In the step shown in FIG. 11(c), a silicon oxide film 23 is deposited over the entire surface of the substrate to fill in the trenches 14.

Figure 11D:
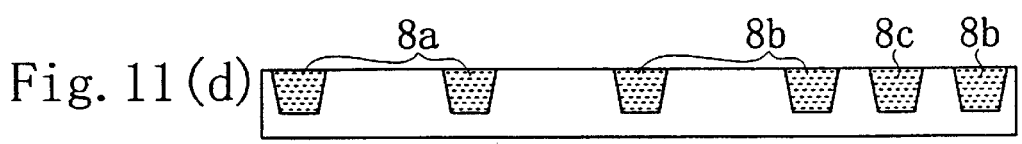

In the step shown in FIG. 11(d), the silicon oxide film 23 is polished by a CMP method. Subsequently, the silicon nitride film 22 and the silicon oxide film 21 are removed selectively to form the plurality of buried trench portions 8 each filled with the silicon oxide film and having a planarized surface. The buried trench portions 8 include: buried trench portions 8a functioning as isolation; buried trench portions 8b forming the dummy semiconductor portions 9; and buried trench portions 8c for providing insulation between the polysilicon wire and the silicon substrate.

Figure 11E:
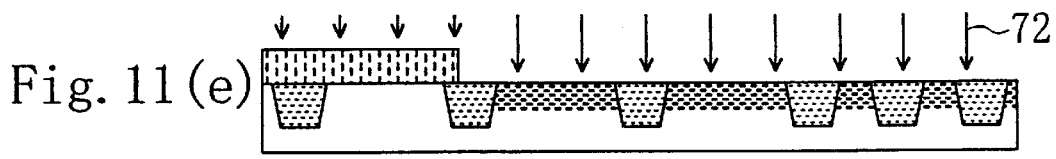

In the step shown in FIG. 11(e), a resist mask 73 covering the active region 6 is formed and oxygen ions 72 are implanted only into the isolation region 7 to form the high resistor portions 71 in the outermost surface of the silicon substrate, in which the oxygen ions have been introduced as an impurity in the semiconductor portions 9 of the isolation region 7.

Figure 11F:
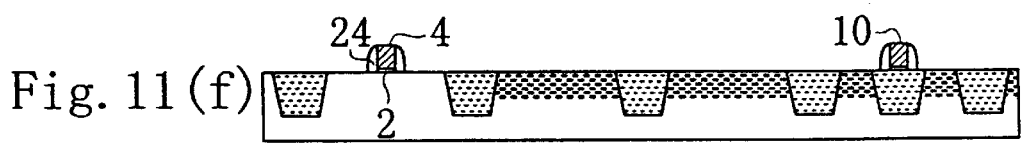

In the step shown in FIG. 11(f), there are formed the gate oxide film 2, the gate electrode 4 having sidewalls 24 on the side faces thereof, and the polysilicon wire 10 by using a known technique. The gate electrode 4 and the polysilicon wire 10 can be formed simultaneously by using a common semiconductor mask.

Figure 11G:
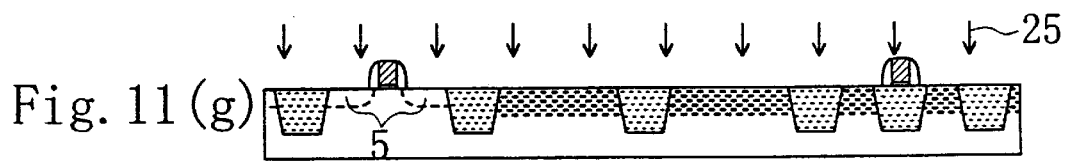

In the step shown in FIG. 11(g), arsenic ions are implanted from above the substrate to form the NMOSFET having the source/drain regions 5 in the active region 6. Although the arsenic ions 25 are also implanted into the isolation region 7 during the process, no trouble occurs. In the case of using a resist mask covering a region to be formed with a PMOSFET, however, the isolation region 7 may be covered with the resist mask.

Figure 11H:
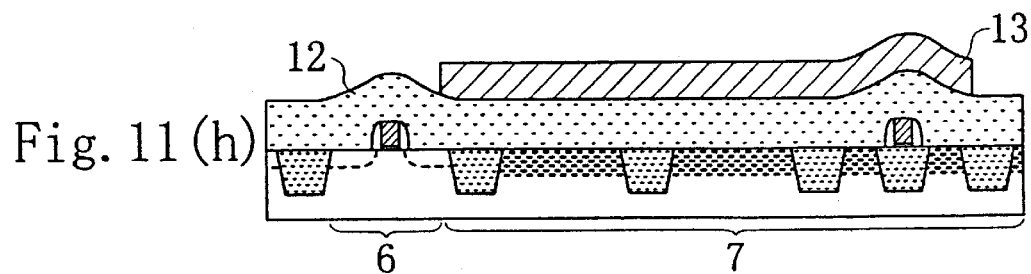

In the step shown in FIG. 11(h), a silicon oxide film is formed as the interlayer insulating film 12, followed by the metal wire 13 formed thereon.

The semiconductor device according to the present embodiment is characterized in that the oxygen atoms have been introduced into the upper portions of the semiconductor portions 9 of the isolation region 7 by ion implantation or the like to form the high resistor portions 71 each composed of a high-resistance silicon layer. Although the bottom faces of the high resistor portions 71 are at a level between the top and bottom faces of the buried trench portions 8, they may be positioned at a level lower than the bottom faces of the buried trench portions 8.

Since the high resistor portions 71 each composed of a high-resistance silicon layer have been formed in the dummy semiconductor portions 9 of the silicon substrate, a voltage drop occurs in the high resistor portions 71 of the silicon substrate when a voltage is placed between the wiring and the substrate. Consequently, a potential difference between the wiring and semiconductor portions 9 is reduced so that the amount of charge is reduced in direct proportion to the placed voltage, though the capacitance of the interlayer insulating film 12 between the wiring and the semiconductor portions 9 is equal to that of the interlayer insulating film 12 in the conventional semiconductor device shown in FIG. 19. Accordingly, the time required for charging or discharging is reduced and the operating speed of the semiconductor device is increased.

Although the present embodiment has described the case where oxygen atoms are introduced as an impurity into the dummy semiconductor portions 9, similar effects can be achieved if nitrogen atoms are introduced.

Although the high resistor portions are formed prior to the formation of the gate electrode in the present embodiment, they may be formed at any stage of the process of manufacturing the semiconductor device provided that oxygen atoms can be introduced into the semiconductor portions.

(Eighth Embodiment)

Figure 12:
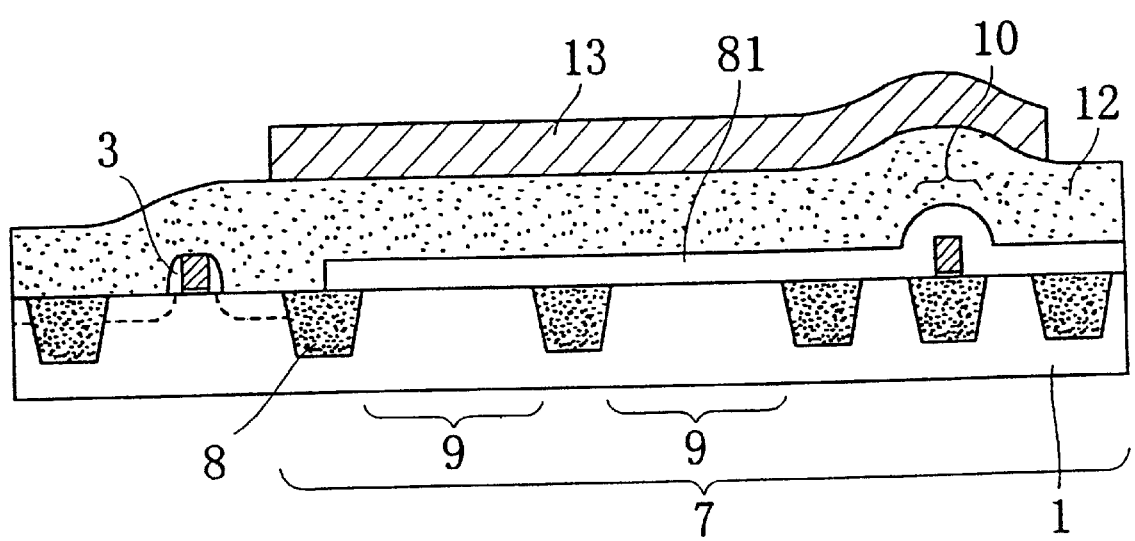
FIG. 12 is a cross-sectional view of a semiconductor device according to an eighth embodiment, having an underlying, having an underlying insulating film formed beneath an interlayer insulating film.

FIG. 12 is a cross-sectional view of a semiconductor device according to an eighth embodiment.

As shown in the drawing, a first active region 6 of a P-type silicon substrate 1 is provided with an element functioning as a MOSFET composed of: a gate oxide film 2; a gate electrode 4 made of a polysilicon film; sidewalls 3 formed on the side faces of the gate electrode 4 and composed of silicon oxide films; and source/drain regions 5. An isolation region 7 for electrically isolating the individual elements is formed with a plurality of trench portions 8 each filled with a silicon oxide film as an insulating material and with dummy semiconductor portions 9 provided between the individual trench portions 8 and not serving as active regions. On one of the trench portions 8 formed in the isolation region 7, there is provided a polysilicon wire 10 formed simultaneously with the gate insulating film 2 and the gate electrode 4. There are further provided an interlayer insulating film 12 made of a silicon oxide film deposited over the entire surface of the substrate and a metal wire 13 formed on the interlayer insulating film 12.

Over the dummy semiconductor portions 9 and trench portions 8 of the isolation region 7, an underlying insulating film 81 made of a silicon oxide film has been formed simultaneously with the sidewalls on the side faces of the gate electrode 4. The underlying insulating film 81 has been formed to cover the entire polysilicon wire 10.

A description will be given next to a method of manufacturing a semiconductor device according to the present embodiment. FIGS. 13(a) to 13(i) are cross-sectional views showing the structure of the semiconductor device having an NMOSFET according to the present embodiment in the manufacturing process therefor.

Figure 13A:
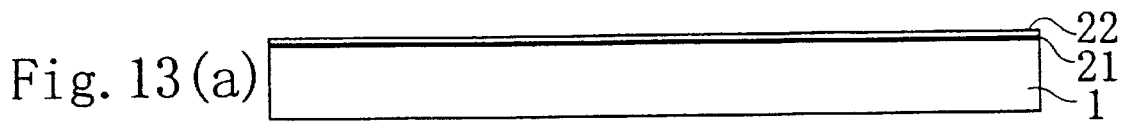
FIGS. 13(a) to 13(i) are cross-sectional views illustrating a process of manufacturing the semiconductor device according to the eighth embodiment.

In the step shown in FIG. 13(a), a thin silicon oxide film 21 having a thickness of 10 nm and a silicon nitride film 22 are formed sequentially on the P-type silicon substrate 1.

Figure 13B:
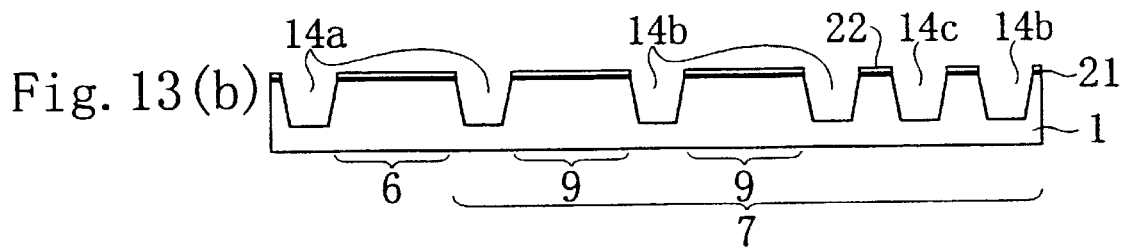

In the step shown in FIG. 13(b), a plurality of trenches 14 each having a given width are formed in the silicon substrate 1. The trenches 14 include: trenches 14a formed to surround the active region 6 to be formed with the element; trenches 14b formed in the isolation region 7 separated from the active region 6 by the trenches 14a to eliminate pattern dependence from planarity obtained at the completion of the manufacturing process; and trenches 14c for forming the polysilicon wires. In the isolation region 7 also, the semiconductor portions 9 have been provided to form at least one projecting portion surrounded by the trenches 14. The semiconductor portions 9 may be considered as dummy active regions which do not function as active regions. The trenches include one formed in a position immediately under the polysilicon wire 10, which is to be formed in the subsequent step.

Figure 13C:
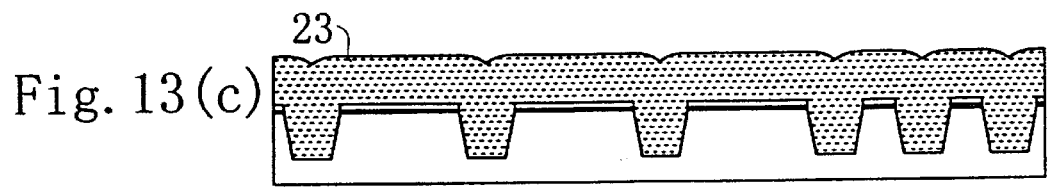

In the step shown in FIG. 13(c), a silicon oxide film 23 is deposited over the entire surface of the substrate to fill in the trenches 14.

Figure 13D:
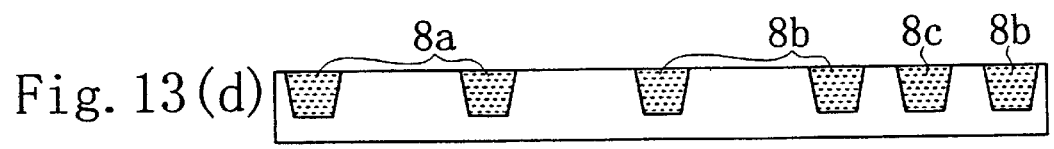

In the step shown in FIG. 13(d), the silicon oxide film 23 is polished by a CMP method. Subsequently, the silicon nitride film 22 and the silicon oxide film 21 are removed selectively to form the plurality of buried trench portions 8 each filled with the silicon oxide film and having a planarized surface. The buried trench portions 8 include: buried trench portions 8a functioning as isolation; buried trench portions 8b forming dummy semiconductor portions 9; and buried trench portions 8c for providing insulation between the polysilicon wire and the silicon substrate.

Figure 13E:
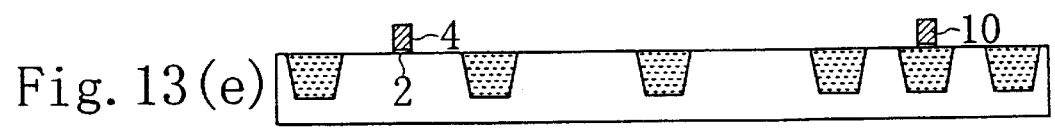

In the step shown in FIG. 13(e), there are formed the gate oxide film 2, the gate electrode 4 made of polysilicon, and the polysilicon wire 10 by using a known technique. The gate electrode 4 can be formed simultaneously with the polysilicon wire 10 by using a common semiconductor mask.

Figure 13F:
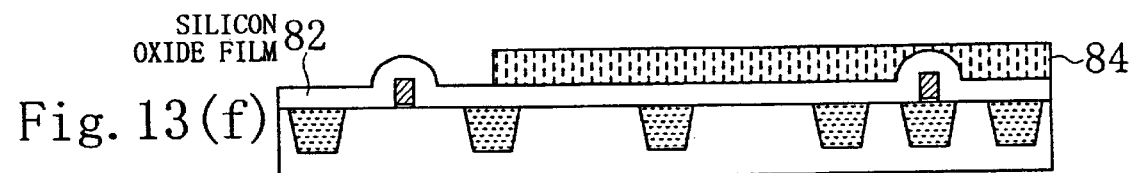

In the step shown in FIG. 13(f), a silicon oxide film 82 is deposited over the entire surface of the substrate, followed by a resist mask 84 formed thereon to cover the isolation region 7.

Figure 13G:
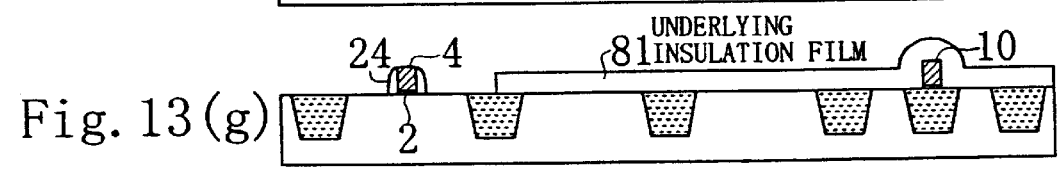

In the step shown in FIG. 13(g), a silicon oxide film 82 is removed selectively by anisotropic dry etching using the resist mask 84 to form an underlying insulating film 81 over the isolation region 7, while the sidewalls are formed on the side faces of the gate electrode 4. The polysilicon wire 10 is completely covered with the underlying insulating film 81.

Figure 13H:
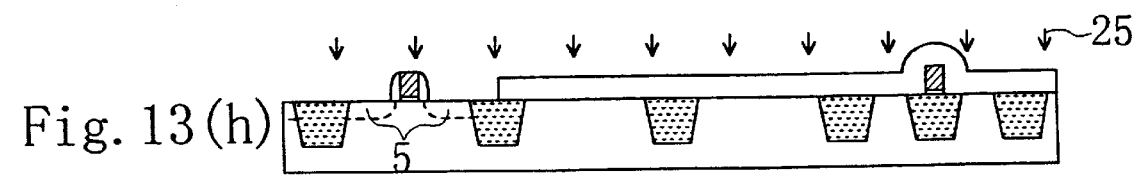

In the step shown in FIG. 13(h), arsenic ions 25 are implanted from above to form the NMOSFET having the source/drain regions 5 in the active region 6. Although the arsenic ions are also implanted into the isolation region 7 during the process, no trouble occurs. However, in the case of using a resist mask covering a region to be formed with a PMOSFET, the isolation region 7 may be covered with the resist mask.

Figure 13I:
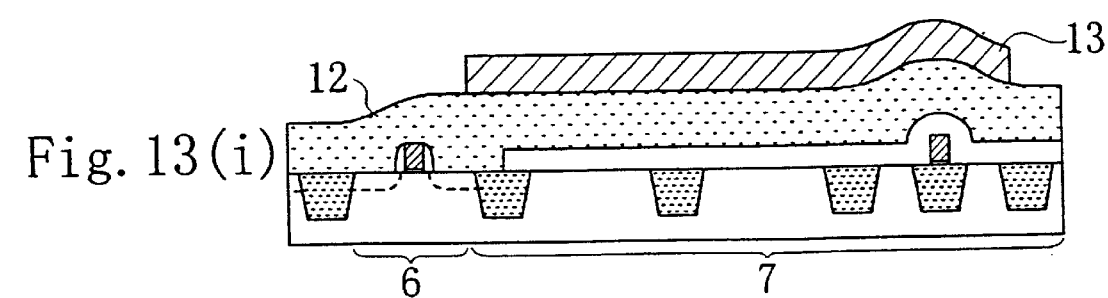

In the step shown in FIG. 13(i), a silicon oxide film is deposited to form the interlayer insulating film 12, followed by a metal wire 13 formed thereon.

The semiconductor device according to the present embodiment is characterized in that the underlying insulating film 81 composed of the silicon oxide film is formed simultaneously with the sidewalls on the side faces of the gate electrode 4 to extend over the dummy semiconductor portions 9 and buried trench portions 8 of the isolation region 7. The resulting underlying insulating film 81 covers the entire polysilicon wire 10.

Thus, in the semiconductor device according to the present embodiment, the underlying insulating film 81 composed of the silicon oxide film is present over the isolation region 7, so that the distance between the wiring and the substrate is longer than in the conventional semiconductor device shown in FIG. 19. Since the wiring-to-substrate capacitance decreases in inverse proportion to the distance, the wiring-to-substrate capacitance is reduced in the semiconductor device according to the present embodiment, resulting in a higher operating speed.

Although the present embodiment has described the case where the underlying insulating film 81 is composed of the silicon oxide film, similar effects can also be achieved if an insulating film composed of a silicon nitride film is used.

Although the present embodiment has described the case where the underlying insulating film is composed of a single-layer film, the underlying insulating film may be composed of a multi-layer film. For example, in the case where the sidewalls consist of L-shaped portions extending over the side faces of the gate electrode and the substrate and of upper wedge-shaped portions or, alternatively, the sidewalls are provided along with an on-gate protective film, the underlying insulating film should be composed of a multi-layer film. It will be appreciated that, in that case also, the same effects as achieved in the present embodiment are achieved.

(Ninth Embodiment)

Figure 14A:
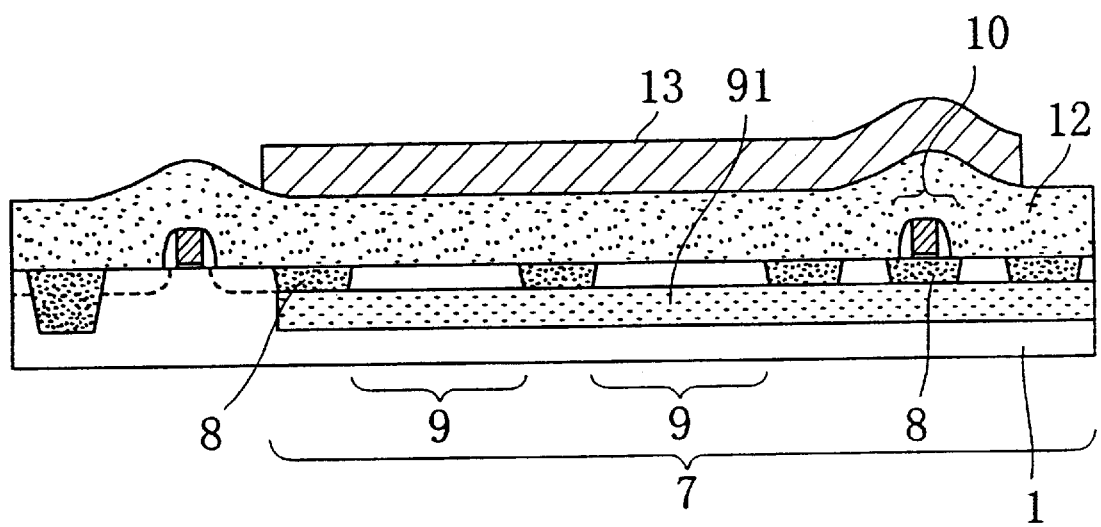
FIG. 14(a) is a cross-sectional view of a semiconductor device according to a ninth embodiment, having a buried insulating film formed over the entire isolation region

FIG. 14(a) is a cross-sectional view of a semiconductor device according to a ninth embodiment.

As shown in the drawing, an active region 6 of a P-type silicon substrate 1 is provided with an element functioning as a MOSFET composed of: a gate oxide film 2; a gate electrode 4 made of a polysilicon film; and source/drain regions 5. An isolation region 7 for electrically isolating the individual elements is formed with a plurality of trench portions 8 each filled with a silicon oxide film as an insulating material and with dummy semiconductor portions 9 provided between the individual trench portions 8 and not serving as active regions. On one of the trench portions 8 formed in the isolation region 7, there is provided a polysilicon wire 10 formed simultaneously with the gate insulating film 2 and the gate electrode 4. There are further provided an interlayer insulating film 12 made of a silicon oxide film deposited over the entire surface of the substrate and a metal wire 13 formed on the interlayer insulating film 12.

Under the dummy semiconductor portions 9 and the trench portions 8, a buried insulating film 91 composed of a silicon oxide film is formed in contact with the bottom faces of the trench portions 8. As a result, the side faces of the semiconductor portions 9 are in contact with the trench portions 8, while the bottom faces thereof are in contact with the buried insulating film 91.

FIG. 14(*b*) is a cross-sectional view for illustrating the wiring-to-substrate capacitance of the semiconductor device according to the present embodiment. In the semiconductor device according to the present embodiment, since the buried insulating film 91 composed of the silicon oxide film is formed in the silicon substrate, the capacitance $C_{ij}$ becomes a half of the capacitance $C_{j1}$ shown in FIG. 1(*b*) or less (T. Nishimura and Y. Inoue: Proceedings of VLSI TECHNOLOGY WORKSHOP ON "WHAT IS THE FUTURE OF SOI?" (1995) p.123).

Therefore, the total wiring-to-substrate capacitance $C_{ijt}$ of the semiconductor device is represented by the following equation (11):

$$C_{ijt}=\{(C_{a1}\times C_{ij})/(C_{a1}+C_{ij})\}+\Sigma C_{a2} \quad (11),$$

which is smaller than the total capacitance $C_{jt}$ represented by the equation (3). Accordingly, the following inequality (12) is satisfied:

$$C_{ijt}<C_{jt} \quad (12).$$

Hence, $$C_{ijt}<C_{at}$$

is derived from the relationship represented by the equation (4), so that the wiring-to-substrate capacitance of the semiconductor device according to the present embodiment is reduced, resulting in the semiconductor device operating at a higher speed.

FIGS. 15(*a*) to 15(*h*) are cross-sectional views of the structure of the semiconductor device having the NMOSFET according to the present embodiment in the manufacturing process therefor.

In the step shown in FIG. 15(*a*), a thin silicon oxide film 21 having a thickness of 10 nm and a silicon nitride film 22 are formed sequentially on the P-type silicon substrate 1.

In the step shown in FIG. 15(*b*), a plurality of trenches 14 each having a given width are formed in the silicon substrate 1. The trenches 14 include: trenches 14*a* formed to surround the active region 6 to be formed with the element; trenches 14*b* formed in the isolation region 7 separated from the active region 6 by the trenches 14*a* to eliminate pattern dependence from planarity obtained at the completion of the manufacturing process; and trenches 14*c* for forming the polysilicon wires. In the isolation region 7 also, the semiconductor portions 9 have been provided to form at least one projecting portion surrounded by the trenches 14. The semiconductor portions 9 may be considered as dummy active regions which do not function as active regions. The trenches include one formed in a position immediately under the polysilicon wire 10, which is to be formed in the subsequent step.

In the step shown in FIG. 15(*c*), a silicon oxide film 23 is deposited over the entire surface of the substrate to fill in the trenches 14.

In the step shown in FIG. 15(*d*), the silicon oxide film 23 is polished by a CMP method. Subsequently, the silicon nitride film 22 and the silicon oxide film 21 are removed selectively to form the plurality of buried trench portions 8 each filled with the silicon oxide film and having a planarized surface. The buried trench portions 8 include: buried trench portions 8*a* functioning as isolation; buried trench portions 8*b* forming dummy semiconductor portions 9; and buried trench portions 8*c* for providing insulation between the polysilicon wire and the silicon substrate.

In the step shown in FIG. 15(*e*), a resist mask 92 covering the active region 6 is formed and oxygen ions 93 are implanted only into the isolation region 7 so that the buried insulating film 91 into which the oxygen atoms have been introduced as an impurity is formed. The buried insulating film 91 provides insulation between the silicon substrate 1 and the semiconductor portions 9 in the isolation region 7. In this case, the buried insulating film 91 is connected to the respective side faces of each of the individual trench portions 8*a* to 8*c* and energy for implanting the oxygen ions is set such that the semiconductor portions 9 are in the floating state.

In the step shown in FIG. 15(*f*), there are formed the gate oxide film 2, the gate electrode 4 having sidewalls 24 on the side faces thereof, and the polysilicon wire 10 by using a known technique. The gate electrode 4 may be formed simultaneously with the polysilicon wire 10 by using a common semiconductor mask.

In the step shown in FIG. 15(*g*), a resist mask 95 is formed to cover the isolation region 7 and arsenic ions 25 are implanted into the active region 6 to form the NMOSFET having the source/drain regions 5. In this case, no implantation is performed with respect to the isolation region 7.

In the step shown in FIG. 15(*h*), a silicon oxide film is deposited to form the interlayer insulating film 12, followed by a metal wire 13 formed thereon.

In the semiconductor device formed by the manufacturing method according to the present embodiment, the buried insulating film 91 composed of the silicon oxide film is formed under the dummy semiconductor portions 9 and the buried trench portions 8 to be in contact with the bottom faces of the buried trench portions 8. As a result, the side faces of the semiconductor portions 9 are in contact with the buried trench portions 8, while the bottom faces thereof are in contact with the insulating film 91. Although the present embodiment has formed the buried insulating film by implanting oxygen ions prior to the formation of the gate electrode, the buried insulating film may be formed at any stage of the method of manufacturing the semiconductor device provided that oxygen atoms can be introduced into the semiconductor portions.

(Tenth Embodiment)

The present embodiment will basically describe another example of the manufacturing process shown in FIG. 14(*b*), which is for achieving the effect of capacitance reduction.

FIGS. 16(*a*) to 16(*i*) are cross-sectional views of the structure of a semiconductor device having an NMOSFET according to a tenth embodiment in the manufacturing process therefor.

In the step shown in FIG. 16(a), a thin silicon oxide film 21 having a thickness of 10 nm and a silicon nitride film 22 are formed sequentially on a P-type silicon substrate 1.

In the step shown in FIG. 16(b), a plurality of trenches 14 each having a given width are formed in the silicon substrate 1. The trenches 14 include: trenches 14a formed to surround an active region 6 to be formed with the element; trenches 14b formed in the isolation region 7 separated from the active region 6 by the trenches 14a to eliminate pattern dependence from planarity obtained at the completion of the manufacturing process; and trenches 14c for forming the polysilicon wires. In the isolation region 7 also, semiconductor portions 9 have been provided to form at least one projecting portion surrounded by the trenches 14. The trenches include one formed in a position immediately under the polysilicon wire 10, which is to be formed in the subsequent step. In the step shown in FIG. 15(c), a silicon oxide film 23 is deposited over the entire surface of the substrate to fill in the trenches 14.

In the step shown in FIG. 16(c), a silicon oxide film 23 is deposited over the entire surface of the substrate to fill in the trenches 14.

In the step shown in FIG. 16(d), the silicon oxide film 23 is polished by a CMP method. Subsequently, the silicon nitride film 22 and the silicon oxide film 21 are removed selectively except for the portions overlying the active region 6 to form a plurality of buried trench portions 8 each filled with a silicon oxide film and having a planarized surface. The buried trench portions 8 include: buried trench portions 8a functioning as isolation; buried trench portions 8b forming dummy semiconductor portions 9; and buried trench portions 8c for providing insulation between the polysilicon wire and the silicon substrate.

In the step shown in FIG. 16(e), the semiconductor portions 9 of the isolation region 7 are subjected to dry etching for forming trenches 96.

In the step shown in FIG. 16(f), a silicon oxide film is deposited in each of the trenches 96 to form a buried insulating film 91, followed by a silicon film deposited thereon to form semiconductor portions 97 serving as dummy active regions. The buried insulating films 91 are in contact with the buried trench portions 8a to 8c.

In the step shown in FIG. 16(g), there are formed the gate oxide film 2, the gate electrode 4 having sidewalls 24 on the side faces thereof, and the polysilicon wire 10 by using a known technique. The gate electrode 4 may be formed simultaneously with the polysilicon wire 10 by using a common semiconductor mask.

In the step shown in FIG. 16(h), a resist mask 98 is formed to cover the isolation region 7 and arsenic ions 25 are implanted into the active region 6 to form the NMOSFET having source/drain regions 5. In this case, implantation may be performed with respect to the isolation region 7, though it is not performed in the example.

In the step shown in FIG. 16(i), a silicon oxide film is deposited to form the interlayer insulating film 12, followed by a metal wire 13 formed thereon.

The manufacturing method according to the present embodiment also enables the formation of a semiconductor device having the same structure as the semiconductor device according to the ninth embodiment, resulting in smaller wiring-to-substrate capacitance and a higher operating speed.

Although the present embodiment has grown the silicon oxide films and the silicon films in the trenches 96 prior to forming the gate electrode, the silicon oxide films and the silicon films may be grown at any stage of the process of manufacturing the semiconductor device provided that they can be grown and buried in the trenches 96.

(Eleventh Embodiment)

Figure 14B:
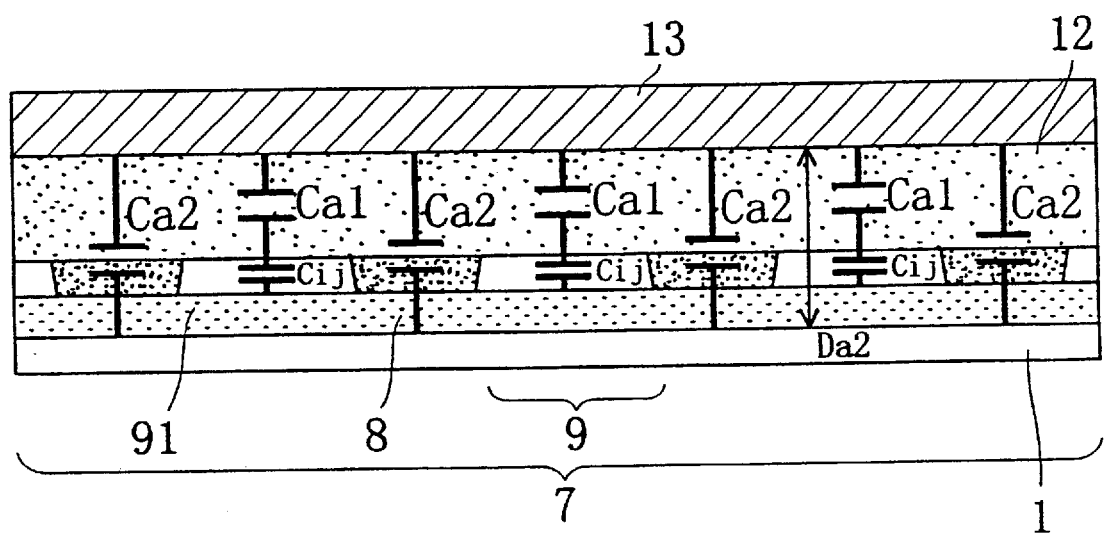
FIG. 14(b) is an enlarged cross-sectional view of the isolation region for illustrating the wiring-to-substrate capacitance in the semiconductor device.

The present embodiment will also basically describe still another example of the manufacturing process shown in FIG. 14(b), which is for achieving the effect of capacitance reduction.

FIGS. 17(a) to 17(f) and FIGS. 18(a) to 18(d) are cross-sectional views showing the structure of a semiconductor device having an NMOSFET according to an eleventh embodiment in the manufacturing process therefor.

Figure 17A:
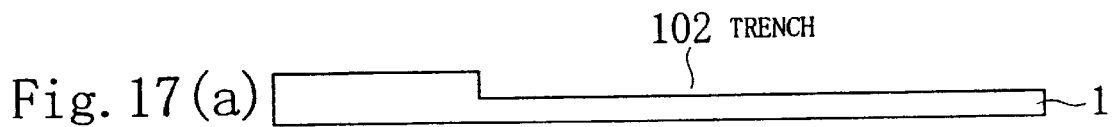
FIGS. 17(a) to 17(f) are cross-sectional views illustrating the first half of a process of manufacturing a semiconductor device according to an eleventh embodiment.

In the step shown in FIG. 17(a), a trench 102 is formed in a region of a P-type silicon substrate 1 in which an isolation region is to be formed.

Figure 17B:

In the step shown in FIG. 17(b), a silicon oxide film is filled in the trench 102 to form an insulating film 101 so that the entire surface of the substrate is planarized.

Figure 17C:
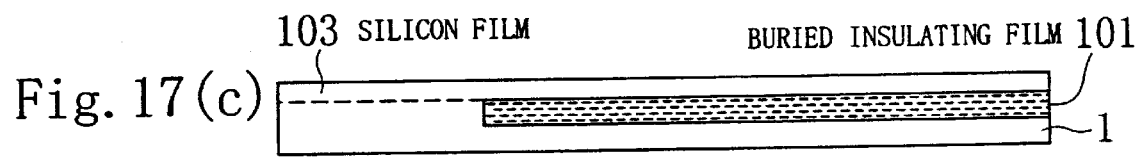

In the step shown in FIG. 17(c), a silicon film 103 is epitaxially grown over the entire surface of the substrate. During the step, since single-crystal silicon is grown on single-crystal silicon in an active region 6, a semiconductor region having an excellent crystallographic property is formed therein, while a silicon film having an inferior crystallographic property is formed on the silicon oxide film in the isolation region 7. However, since the silicon film in the isolation region 7 does not function as an active region, the inferior crystallographic property thereof will not adversely affect the properties of the semiconductor device.

Figure 17D:
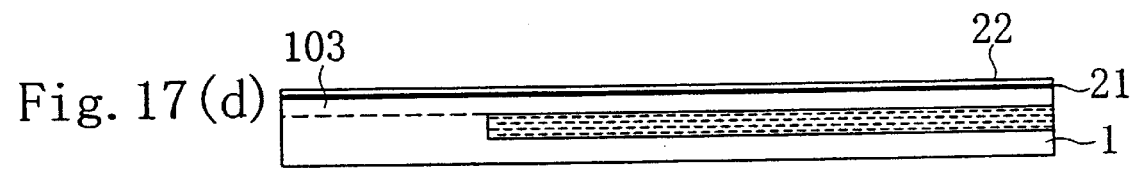

In the step shown in FIG. 17(d), a thin silicon oxide film 21 having a thickness of 10 nm and a silicon nitride film 22 are formed sequentially on the silicon film 103.

Figure 17E:
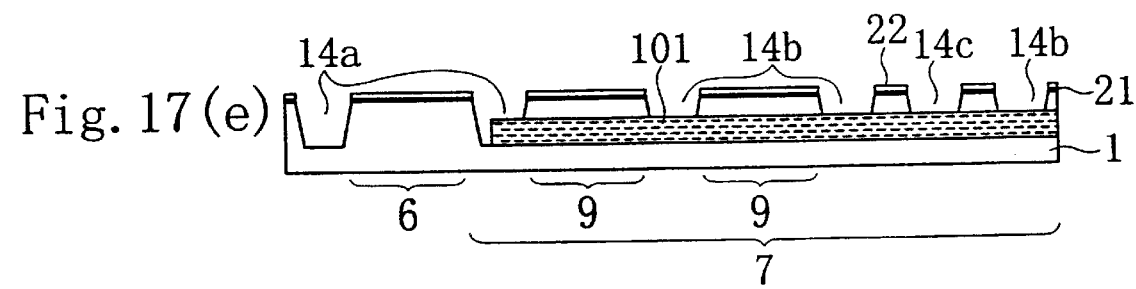

In the step shown in FIG. 17(e), a plurality of trenches 14 each having a given width are formed in the substrate. The trenches 14 include: trenches 14a formed to surround the active region 6 to be formed with the element; trenches 14b formed in the isolation region 7 separated from the active region by the trenches 14a to eliminate pattern dependence from planarity obtained at the completion of the manufacturing process; and trenches 14c for forming the polysilicon wires. In the isolation region 7 also, semiconductor portions 9 have been provided to form at least one projecting portion surrounded by the trenches 14. The semiconductor portions 9 may be considered as dummy active regions which do not function as active regions. The trenches include one formed in a position immediately under the polysilicon wire 10, which is to be formed in the subsequent step. In forming the trenches 14, etching is performed till the surface of the buried insulating film 101 is exposed in the trenches 14.

Figure 17F:
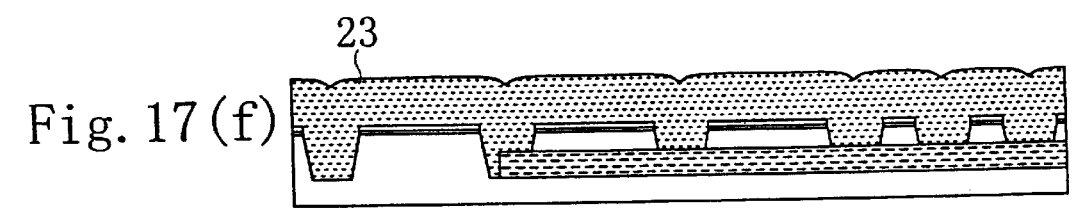

In the step shown in FIG. 17(f), a silicon oxide film 23 is deposited over the entire surface of the substrate to fill in the trenches 14.

Figure 18A:
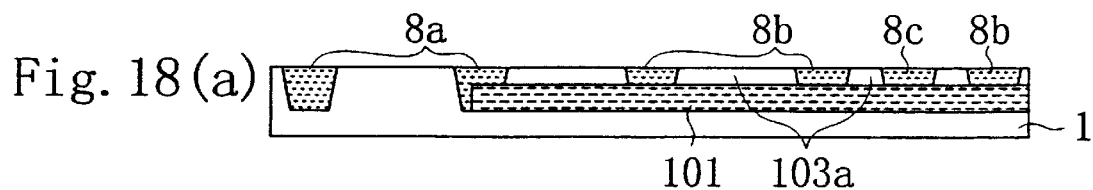
FIGS. 18(a) to 18(d) are cross-sectional views illustrating the second half of the process of manufacturing the semiconductor device according to the eleventh embodiment.

In the step shown in FIG. 18(a), the silicon oxide film 23 is polished by a CMP method. Subsequently, the silicon nitride film 22 and the silicon oxide film 21 are removed selectively to form a plurality of buried trench portions 8 each filled with a silicon oxide film and having a planarized surface. The buried trench portions 8 include: buried trench portions 8a functioning as isolation; buried trench portions 8b forming dummy semiconductor portions 9; and buried trench portions 8c for providing insulation between the polysilicon wire and the silicon substrate.

Figure 18B:
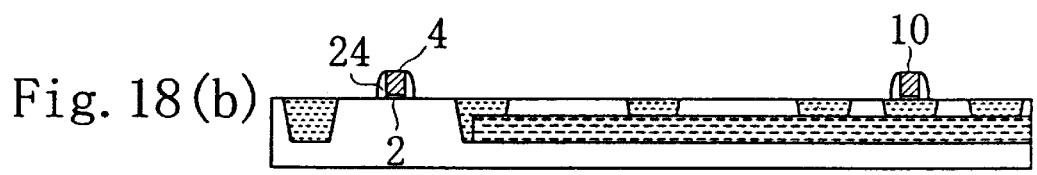

In the step shown in FIG. 18(b), there are formed the gate oxide film 2, the gate electrode 4 having sidewalls 24 on the side faces thereof, and the polysilicon wire 10 by using a known technique. The gate electrode 4 is formed simultaneously with the polysilicon wire 10.

Figure 18C:
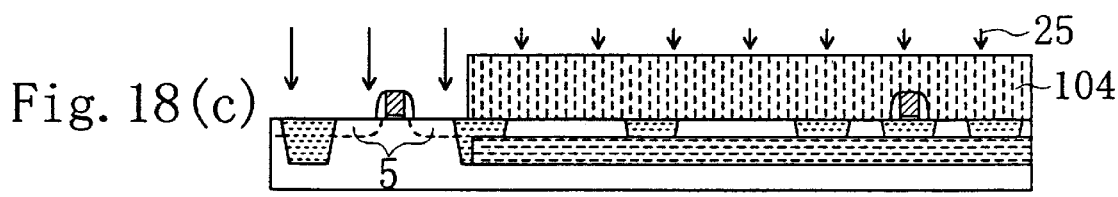

In the step shown in FIG. 18(c), arsenic ions 25 are implanted into the active region 6 to form source/drain regions 5 by using a resist mask 95 formed to cover the isolation region 7. The NMOSFET is formed by the foregoing process. Although arsenic ions 25 are not implanted in the isolation region 7 in the example, they may be implanted alternatively.

Figure 18D:
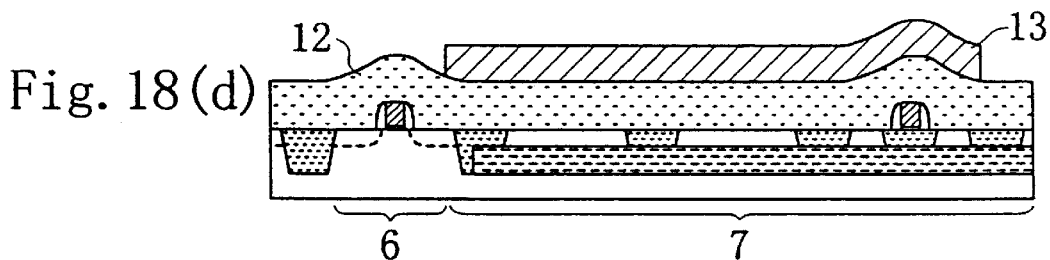

In the step shown in FIG. 18(d), a silicon oxide film is deposited to form an interlayer insulating film 12, followed by a metal wire 13 formed thereon.

The manufacturing method according to the present embodiment also enables the formation of a semiconductor device having the same structure as the semiconductor device according to the ninth embodiment, resulting in smaller wiring-to-substrate capacitance and a higher operating speed.

Although the present embodiment has formed the trench 102 in the silicon substrate 1 and buried the silicon oxide film therein to form a miniaturized gate electrode 4, the silicon oxide film may be formed directly on the isolation region without forming the trench if the semiconductor substrate inferior in planarity does not adversely affect the patterning of the gate during the formation of the gate electrode.

(Variations of Individual Embodiments)

Although the eighth embodiments of the present invention have been described, there are variations obtained by combining the individual embodiments with each other.

By way of example, the first embodiment used in combination with the second to eighth embodiments achieves a further reduction in wiring-to-substrate capacitance and a reduction in time required for charging or discharging, so that the resulting semiconductor device operates at a higher speed than in the case where each of the embodiments is used singly.

Thus, according to the present invention, the individual embodiments used in combination can achieve more remarkable effects than in the case where each of the embodiments is used singly.

Although each of the embodiments has used the NMOSFET as the element to be disposed in the active region 6, the present invention is not limited to such embodiments. The element includes an active element other than the MOSFET such as a bipolar transistor or diode or a passive element such as a capacitor.

We claim:

1. A semiconductor device comprising:
   a semiconductor substrate having an active region and an isolation region surrounding said active region;
   a first trench portion filled with an insulating material formed to separate said active region from said isolation region;
   a second trench portion filled with an insulating material formed to separate a plurality of dummy semiconductor portions in said isolation region;
   an interlayer insulating film formed to extend continuously over said active region and said isolation region;
   a wire formed on said interlayer insulating film covering said dummy semiconductor portions and said second trench portion in said isolation region; and
   at least one PN junction formed in said dummy semiconductor portions underlying said wire.

2. A semiconductor device according to claim 1, wherein said PN junction includes a plurality of PN junctions formed in said dummy semiconductor portions.

3. A semiconductor device according to claim 1, wherein said active region is formed with an impurity diffusion region and a PN junction is formed at a bottom face of said impurity diffusion region, the PN junction of said isolation region being positioned at a level lower than the PN junction of said active region.

4. A semiconductor device according to claim 1, wherein said PN junction formed in said dummy semiconductor portion is positioned at a level between a top surface and a bottom surface of said second trench portion.

5. A semiconductor device according to claim 1, wherein said PN junction formed in said dummy semiconductor portion is positioned at a level below a bottom surface of said second trench portion.

6. A semiconductor device comprising:
   a semiconductor substrate having an active region and an isolation region surrounding said active region;
   a first trench portion filled with an insulating material formed to separate said active region from said isolation region;
   a second trench portion filled with an insulating material formed to separate a plurality of dummy semiconductor portions in said isolation region;
   an interlayer insulating film formed to extend continuously over said active region and said isolation region;
   a wire formed on said interlayer insulating film covering said dummy semiconductor portions and said second trench portion in said isolation region; and
   a dielectric film interposed between at least said dummy semiconductor portions of said isolation region and said interlayer insulating film.

7. A semiconductor device according to claim 6, wherein said dielectric film is an underlying insulating film interposed between said interlayer insulating film and said dummy semiconductor portions and said second trench portion.

8. A semiconductor device according to claim 7, further comprising a gate electrode formed on the semiconductor substrate within said active region and sidewalls made of an insulating material and formed on both side faces of said gate electrode, wherein said underlying insulating film is formed of the same film as forming said sidewalls.

9. A semiconductor device according to claim 8, wherein said underlying insulating film is composed of a multilayer film.

10. A semiconductor device according to claim 6, wherein said dielectric film is formed in an upper portion of each of said dummy semiconductor portions of the semiconductor substrate to have a top face at approximately the same level as a top face of each of said second trench portion.

11. A semiconductor device according to claim 6, wherein said dielectric film is composed of at least one of a silicon oxide film and a silicon nitride film.

12. A semiconductor device comprising:
   a semiconductor substrate having an active region and an isolation region surrounding said active region;
   a first trench portion filled with an insulating material formed to separate said active region from said isolation region;
   a second trench portion filled with an insulating material formed to separate a plurality of dummy semiconductor portions in said isolation region;
   an interlayer insulating film formed to extend continuously over said active region and said isolation region;
   a wire formed on said interlayer insulating film covering said dummy semiconductor portions and said second trench portion in said isolation region; and
   a buried insulating film formed only in said isolation region, and in an inner portion of each of said dummy semiconductor portions in said isolation region.

13. A semiconductor device comprising:
a semiconductor substrate having an active region and an isolation region surrounding said active region;
a first trench portion filled with an insulating material formed to separate said active region from said isolation region;
a second trench portion filled with an insulating material formed to separate a plurality of dummy semiconductor portions in said isolation region;
an interlayer insulating film formed to extend continuously over said active region and said isolation region;
a wire formed on said interlayer insulating film covering said dummy semiconductor portions and said second trench portion in said isolation region; and
a resistor film formed under said wire, and between said interlayer insulating film and at least said dummy semiconductor portions of said isolation region.

14. A semiconductor device according to claim 13, wherein said resistor film is an underlying resistor film formed to extend continuously over said dummy semiconductor portions and said second trench portions.

15. A semiconductor device according to claim 14, further comprising a resistor element formed on said semiconductor substrate and having a high resistor film, wherein said underlying resistor film is formed of the same film as composing the high resistor film of said resistor element.

16. A semiconductor device according to claim 14, further comprising an element having an electrode member composed of a conductor film formed on the semiconductor substrate within said active region, wherein said resistor film is composed of the same material as composing said electrode member.

17. A semiconductor device according to claim 14, further comprising a FET having a gate electrode composed of a first conductor film formed on the semiconductor portion within said active region and a second conductor film deposited on said first conductor film, wherein
a top surface of the first conductor film of said gate electrode is at approximately the same level as a top surface of said first trench portion and said second trench portion,
a region of said resistor film overlying each of said semiconductor portions is formed of the same two films as composing said first and second conductor films of said gate electrode, and
a region of said resistor film overlying said first trench portion and said second trench portion is composed of the same material as composing said first conductor film of said gate electrode.

18. A semiconductor device according to claim 13, wherein said resistor film is formed in an upper portion of each of said dummy semiconductor portions of the semiconductor substrate to have a top face at approximately the same level as a top surface of said second trench portion.

19. A semiconductor device according to claim 18, wherein said resistor film is composed of a silicon film containing at least one of an oxygen atom and a nitrogen atom.

20. A semiconductor device according to claim 13, wherein said resistor film is composed of at least one of a polysilicon film and an amorphous silicon film.

* * * * *